(12) United States Patent
Yokoyama

(10) Patent No.: US 7,505,245 B2
(45) Date of Patent: Mar. 17, 2009

(54) SEMICONDUCTOR PHYSICAL QUANTITY SENSOR AND METHOD FOR MANUFACTURING THE SAME

(75) Inventor: Kenichi Yokoyama, Nagoya (JP)

(73) Assignee: DENSO CORPORATION, Kariya (JP)

( * ) Notice: Subject to any disclaimer, the term of this patent is extended or adjusted under 35 U.S.C. 154(b) by 404 days.

(21) Appl. No.: 11/226,248

(22) Filed: Sep. 15, 2005

(65) Prior Publication Data

US 2006/0057758 A1    Mar. 16, 2006

(30) Foreign Application Priority Data

Sep. 16, 2004   (JP)   ............................. 2004-269540

(51) Int. Cl.
*H01G 7/00*   (2006.01)
(52) U.S. Cl. ....................... 361/277; 361/272; 361/286; 361/287; 361/290; 361/292
(58) Field of Classification Search ......... 361/272–278, 361/279, 281, 292, 286, 287, 290; 73/514.16, 73/514.32
See application file for complete search history.

(56) References Cited

U.S. PATENT DOCUMENTS

| 5,427,975 | A | | 6/1995 | Sparks et al. |
| 5,616,523 | A | | 4/1997 | Benz et al. |
| 5,683,591 | A | | 11/1997 | Offenberg |
| 6,127,908 | A | * | 10/2000 | Bozler et al. ................ 333/246 |

OTHER PUBLICATIONS

Sae Technical Paper Series, "Single Crystal Silicon Low-g Acceleration Sensor," 2002-01-1080. SAE 2002 World Congress, Detroit, Michigan. Mar. 4-7, 2002. (discussed on p. 45 in the specification).

* cited by examiner

*Primary Examiner*—Nguyen T Ha
(74) *Attorney, Agent, or Firm*—Posz Law Group, PLC

(57) ABSTRACT

A method for manufacturing a semiconductor physical quantity sensor including a support substrate, a movable electrode, a fixed electrode is provided. The method includes the steps of: preparing a multi-layered substrate; forming a compression stress layer on a part of a surface of the semiconductor layer; forming a trench in the semiconductor layer; and releasing the movable electrode from the substrate by removing the insulation film. In the step of releasing, the part of the semiconductor layer, on which the compression stress layer is disposed, is cambered by the compression stress toward a direction apart from the substrate.

10 Claims, 10 Drawing Sheets

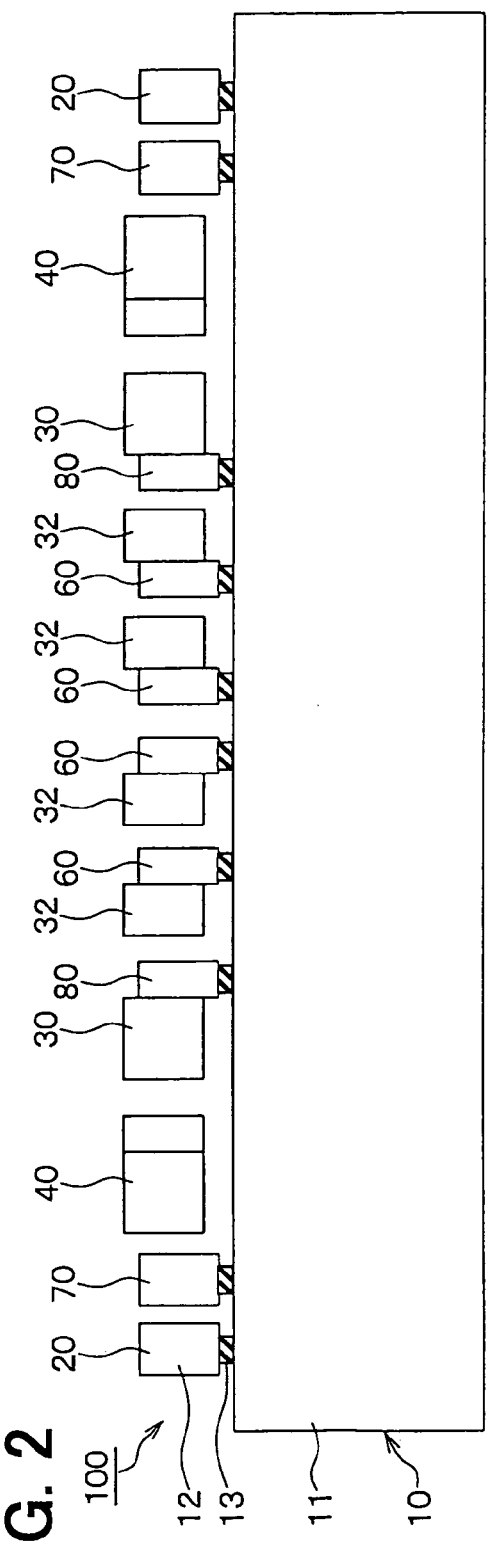
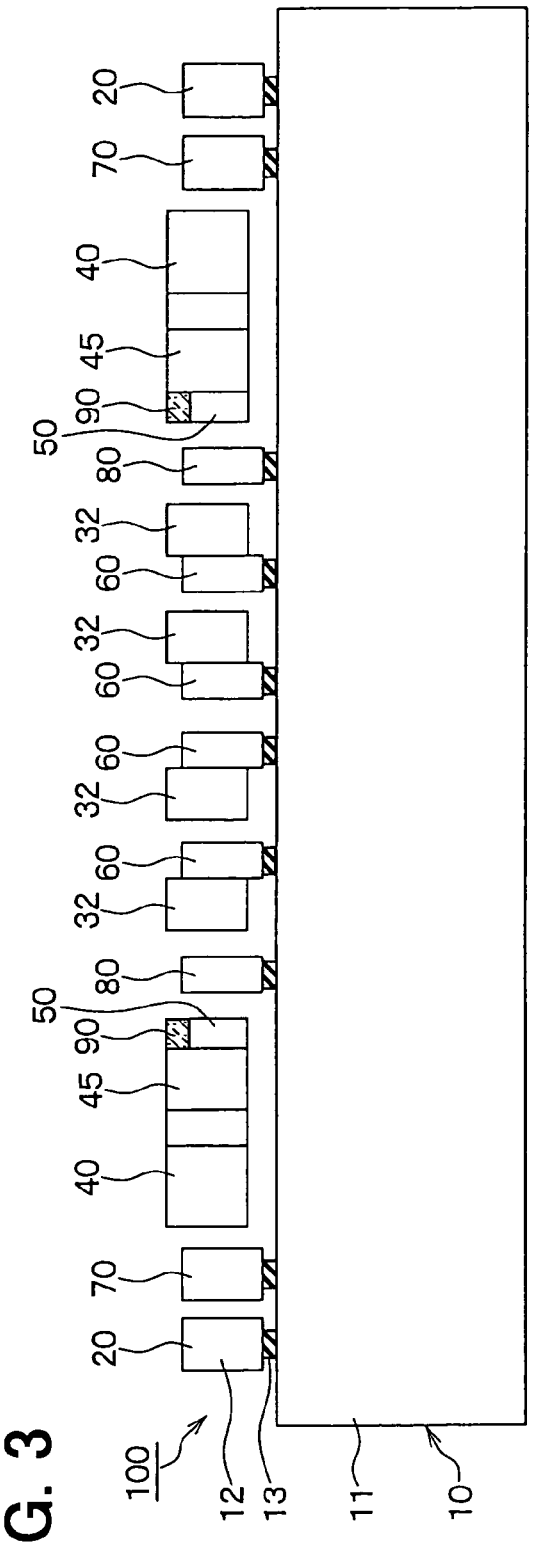

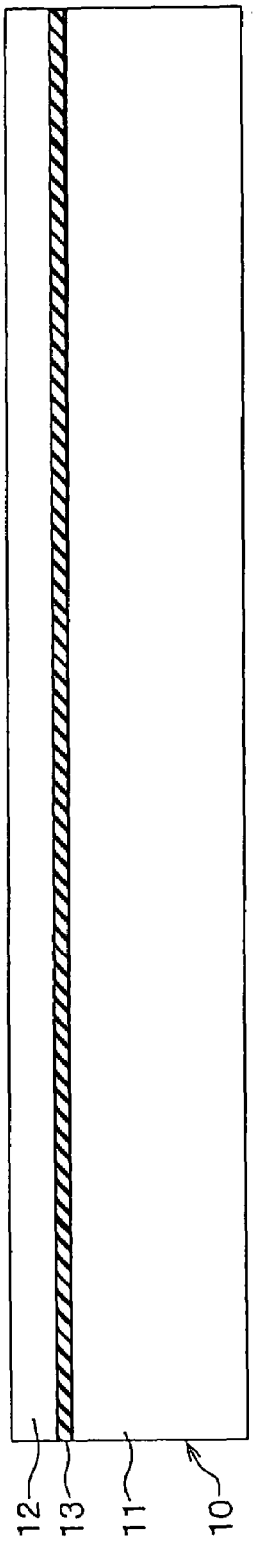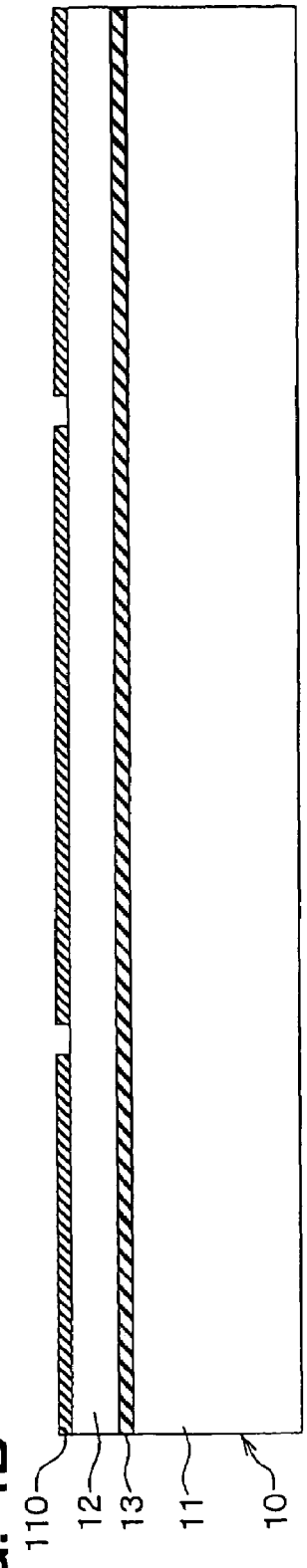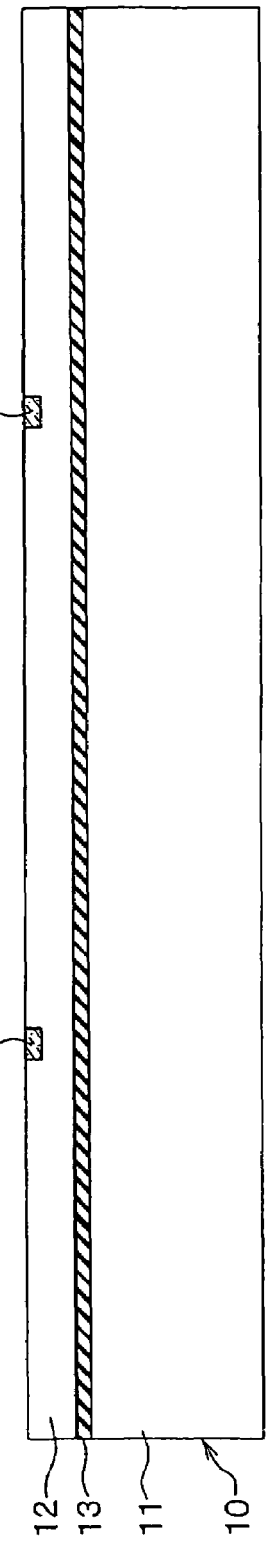

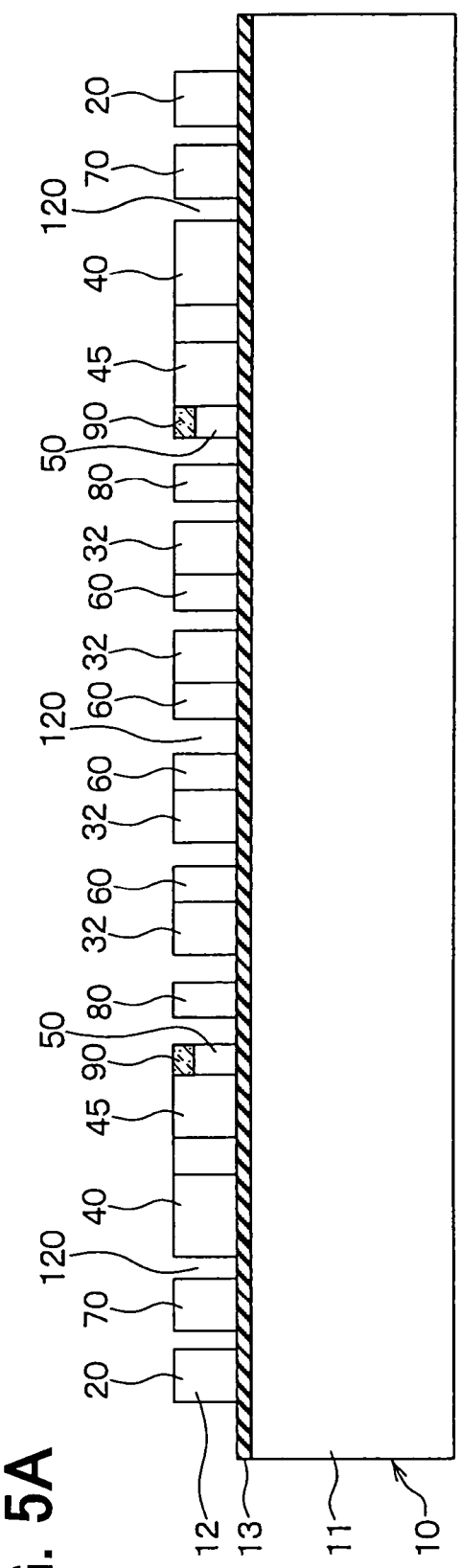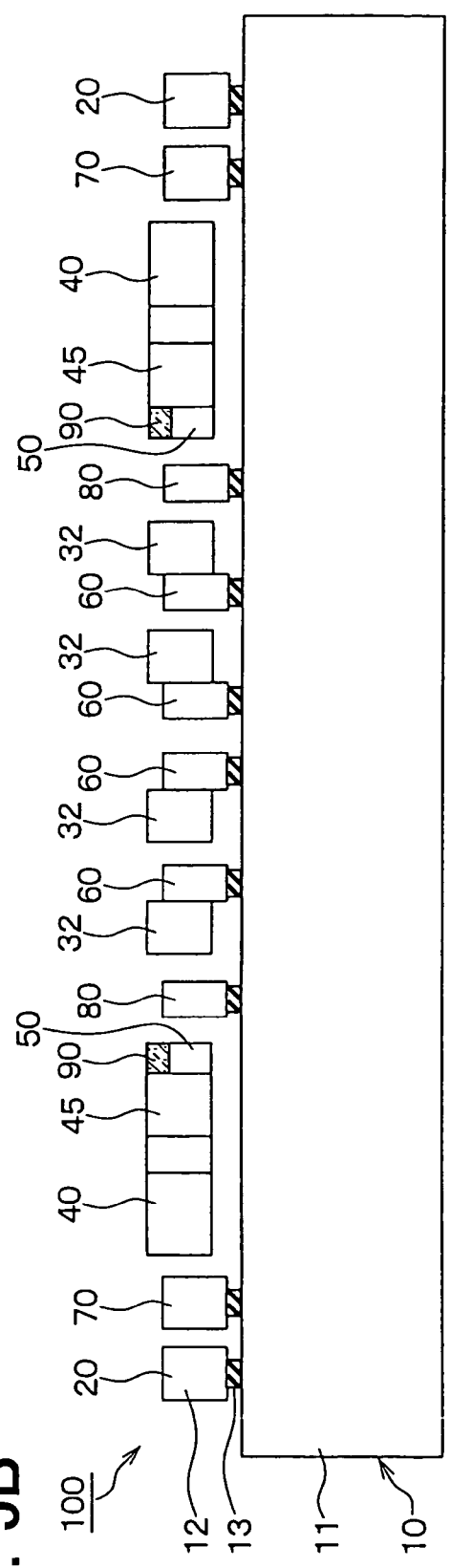

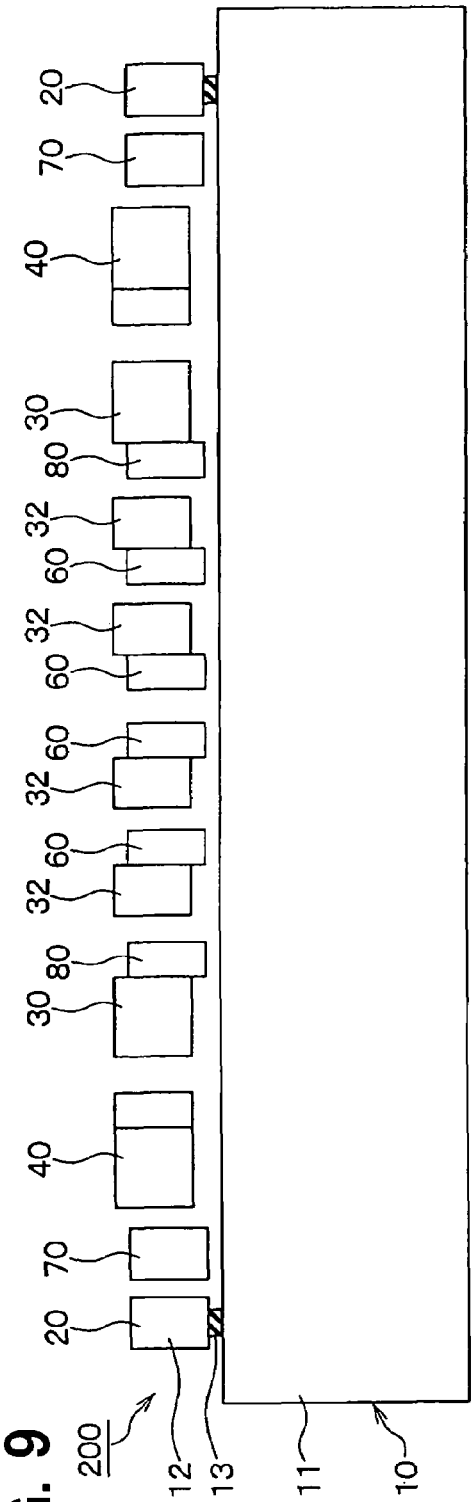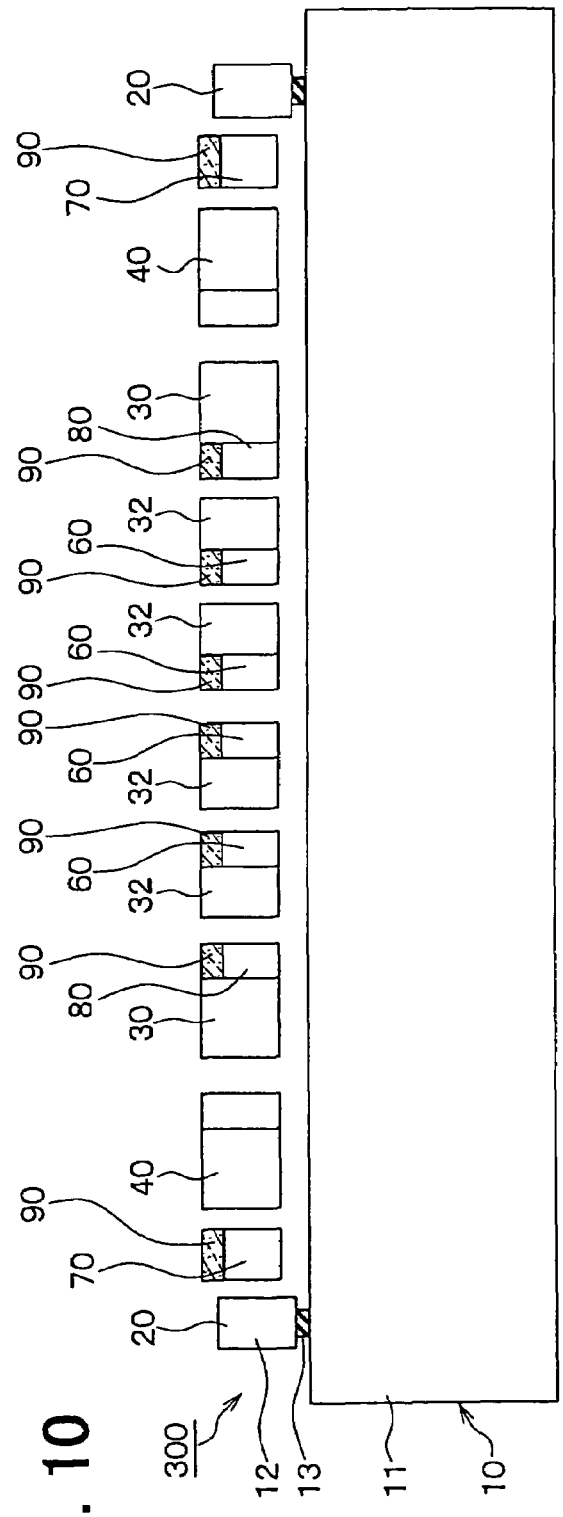

SEMICONDUCTOR PHYSICAL QUANTITY SENSOR AND METHOD FOR MANUFACTURING THE SAME

CROSS REFERENCE TO RELATED APPLICATION

This application is based on Japanese Patent Application No. 2004-269540 filed on Sep. 16, 2004, the disclosure of which is incorporated herein by reference.

FIELD OF THE INVENTION

The present invention relates to a semiconductor physical quantity sensor and a method for manufacturing the same.

BACKGROUND OF THE INVENTION

A capacitance type semiconductor physical quantity sensor includes a movable electrode and a fixed electrode located opposite to the movable electrode, which are formed on a support substrate. A physical quantity is detected based upon a capacitance change between the movable electrode and the fixed electrode.

Generally speaking, this sort of semiconductor physical quantity sensor is equipped with a movable electrode and a fixed electrode, and detects a physical quantity based upon a capacitance change between the movable electrode and the fixed electrode when a physical quantity is applied to this sensor. The movable electrode is coupled on a support substrate under such a condition that the movable electrode is movable with respect to the support substrate. The fixed electrode is coupled on the support substrate under such a condition that the fixed electrode is fixed to the support substrate, and arranged opposite to the movable electrode.

As such a semiconductor physical quantity sensor for measuring a physical quantity based upon a change in an electrostatic capacitance, acceleration sensors, angular rate sensors, gyroscopes, pressure sensors, and the like are known in this field.

Then, these capacitance type semiconductor physical quantity sensors are applied to various sorts of utilizations as, for example, sensors for controlling automobile-purpose air bags, sensors for controlling stabilities of automotive vehicles, and sensors for commercial-purpose game amusements, and the like.

Such semiconductor physical quantity sensors can be manufactured in accordance with a manufacturing method to which a semiconductor technique is applied, namely, such a manufacturing method utilizing a so-called "MEMS (Micro Electro Mechanical Systems)." This general-purpose manufacturing method is carried out as follows:

First, a stacked layer substrate is prepared which is manufactured by stacking semiconductor layers via an insulating layer on a support substrate. As such a stacked layer substrate, a silicon-on insulator substrate (SOI substrate) is typically employed in which both a support substrate and a semiconductor layer are made of silicon, and an insulating layer is made of a silicon oxide film.

Then, trenches are formed with respect to the semiconductor layer of the stacked layer substrate, while the trenches are reached from a front surface of the semiconductor layer to the insulating layer, and segment patterns of a movable electrode and a fixed electrode. Thereafter, such an insulating layer is removed which is positioned under a sensor portion which should constitute the movable electrode in order that the movable electrode is released from the support substrate. As a result, a semiconductor physical quantity sensor is manufactured.

In this case, in this sort of semiconductor physical quantity sensor, as to electrode materials of a movable electrode and a fixed electrode which are employed so as to provide capacitances, low-cost single crystal silicon and polycrystal silicon is employed as semiconductor materials in order to employ semiconductor techniques.

More specifically, in order to improve sensor sensitivities, it is preferable to form a single crystal silicon electrode by employing an adhered SOI wafer for the sake of an increase of a capacitance value between a movable electrode and a fixed electrode. In this adhered SOI wafer, thicknesses of these electrodes can be readily achieved.

Also, in the MEMS technique, a desirable structural body is formed by using both a front surface processing operation and a rear surface processing operation of a semiconductor silicon wafer. Due to a matching characteristic with respect to a general-purpose LSI manufacturing facility, if this semiconductor silicon wafer can be processed from the front surface thereof, then a more convenient effect may be achieved.

For instance, as a conventional method for manufacturing this sort of the semiconductor physical quantity sensor, one method of forming a semiconductor physical quantity sensor in which an SOI substrate is employed and an embedded oxide film corresponding to an insulating layer is employed as a sacrifice layer is proposed. This method is disclosed in, for example, Japanese Laid-open Patent Application No. Hei-6-349806, which corresponds to U.S. Pat. No. 5,616,523.

On the other hand, typical layer thickness is a smaller dimension than 1 micrometer. Therefore, the dimension of the gap among the movable electrode and the fixed electrode and also the support substrate which corresponds to the supporting member of these electrodes is secured by the thickness of the thin embedded oxide film.

Here, thicknesses of embedded oxide films of SOI wafers are nearly equal to several micrometers (2 to 3 micrometers) at the most. Accordingly, the gap between the movable electrode and the fixed electrode is as thin as several microns at the most.

However, in such a case that semiconductor physical quantity sensors having such a thin gap between these electrodes and the support substrates are manufactured, there are some possibilities that foreign matters such as particles are mixed in this gap in the manufacturing stage thereof.

If the mixtures of these foreign matters occur, then the movable electrode which should be released via the above-described gap on the support substrate may abut against these foreign matters, and thus, can be hardly moved. Thus, the normal movement of the movable electrode is impeded. As previously explained, the mixture of the foreign matters may conduct problems in sensor characteristics, and also, may lower the field of the production.

In this case, the below-mentioned method using such an SOI wafer is conceivable. That is, in this SOI wafer, even when foreign matters are mixed into the air gap between the movable electrode and the support substrate, the thickness of the sacrifice layer is made thicker, namely the thickness of the embedded oxide film corresponding to the insulating layer is made thicker in order to suppress the adverse influence caused by these foreign matters.

As a result of this method using such an SOI wafer, it is conceivable that since the gap may be widened, the interference between the movable electrode and the foreign matters can be suppressed. However, generally speaking, since the SOI wafers having the thick thicknesses of the embedded oxide films as the sacrifice layers become high cost, the use of these SOI wafers is not desirable. Thus, it is required to improve a production yield caused by mixtures of foreign matters between the movable electrode and the support substrate, while a thickness of an insulating layer corresponding to a sacrifice layer is not made thick.

SUMMARY OF THE INVENTION

In view of the above-described problem, it is an object of the present invention to provide a semiconductor physical quantity sensor. It is another object of the present invention to provide a method for manufacturing a semiconductor physical quantity sensor.

A method for manufacturing a semiconductor physical quantity sensor is provided. The sensor includes a support substrate, a movable electrode movably disposed on the support substrate, and a fixed electrode fixedly disposed on the substrate and facing the movable electrode. The sensor detects a physical quantity on the basis of a capacitance change of a capacitor provided between the movable electrode and the fixed electrode. The method includes the steps of: preparing a multi-layered substrate including the support substrate, an insulation film and a semiconductor layer, which are stacked in this order; forming a compression stress layer on a part of a surface of the semiconductor layer, the part to be a connection portion between the movable electrode and the substrate, wherein the compression stress layer generates a compression stress; forming a trench in the semiconductor layer in such a manner that the trench is disposed from the surface of the semiconductor layer to the insulation film, and that the trench separates the movable electrode and the fixed electrode; and releasing the movable electrode from the substrate by removing the insulation film. In the step of releasing the movable electrode, the part of the semiconductor layer, on which the compression stress layer is disposed, is cambered by the compression stress of the compression stress layer toward a direction apart from the substrate.

In the above method, since the connection portion between the movable electrode and the substrate is cambered toward the direction apart from the substrate, the distance between the movable electrode and the substrate becomes larger, compared with the distance between the fixed electrode and the substrate. Thus, without increasing the thickness of the insulation film as a sacrifice layer, the distance between the movable electrode and the substrate becomes larger. Thus, even if a foreign particle is inserted between the movable electrode and the substrate, the motion of the movable electrode is not affected by the foreign particle. Thus, the movable electrode works normally. Accordingly, manufacturing yield of the sensor is improved.

Preferably, the fixed electrode is cantilevered on the support substrate.

Preferably, in the step of forming the compression stress layer, the compression stress layer is formed on a part of the semiconductor layer to be the fixed electrode, and in the step of releasing the movable electrode, the fixed electrode is cantilevered so that the fixed electrode is cambered by the compression stress of the compression stress layer toward the direction apart from the support substrate.

Further, a semiconductor physical quantity sensor for detecting a physical quantity includes: a support substrate; a movable electrode movably supported on the substrate; and a fixed electrode fixed on the substrate and facing the movable electrode. The physical quantity is detected on the basis of a capacitance change of a capacitor provided between the movable electrode and the fixed electrode. The movable electrode faces the fixed electrode in such a manner that the movable electrode is shifted toward a direction apart from the substrate.

In this case, since the movable electrode is shifted toward a direction apart from the substrate, the distance between the movable electrode and the substrate becomes larger, compared with the distance between the fixed electrode and the substrate. Thus, without increasing the thickness of the insulation film as a sacrifice layer, the distance between the movable electrode and the substrate becomes larger. Thus, even if a foreign particle is inserted between the movable electrode and the substrate, the motion of the movable electrode is not affected by the foreign particle. Thus, the movable electrode works normally. Accordingly, manufacturing yield of the sensor is improved.

Preferably, the sensor further includes a compression stress layer disposed on a surface of a connection portion between the movable electrode and the support substrate. The compression stress layer is capable of generating a compression stress. The connection portion is cambered toward the direction apart from the substrate so that the movable electrode is shifted.

Further, a semiconductor physical quantity sensor for detecting a physical quantity includes: a support substrate; a movable electrode movably supported on the substrate; and a fixed electrode fixed on the substrate and facing the movable electrode. The physical quantity is detected on the basis of a capacitance change of a capacitor provided between the movable electrode and the fixed electrode. The movable electrode has a thickness in a direction perpendicular to the substrate, the thickness which is equal to a thickness of the fixed electrode in the direction perpendicular to the substrate. The movable electrode is apart from the substrate by a predetermined distance, which is different from a distance between the fixed electrode and the substrate.

In this case, the movable electrode is apart from the substrate by a predetermined distance, which is different from a distance between the fixed electrode and the substrate. Thus, without increasing the thickness of the insulation film as a sacrifice layer, the distance between the movable electrode and the substrate becomes larger. Thus, even if a foreign particle is inserted between the movable electrode and the substrate, the motion of the movable electrode is not affected by the foreign particle. Thus, the movable electrode works normally. Accordingly, manufacturing yield of the sensor is improved.

Preferably, the movable electrode is apart from the fixed electrode by a distance, which is smaller than the distance between the fixed electrode and the substrate, and the distance between the fixed electrode and the substrate is smaller than the distance between the movable electrode and the substrate.

BRIEF DESCRIPTION OF THE DRAWINGS

The above and other objects, features and advantages of the present invention will become more apparent from the following detailed description made with reference to the accompanying drawings. In the drawings:

FIG. 2 is a cross sectional view showing the sensor taken along line II-II in FIG. 1;

FIG. 3 is a cross sectional view showing the sensor chip taken along line III-III in FIG. 1;

FIGS. 4A to 4C are cross sectional views explaining a method for manufacturing the sensor according to the first embodiment;

FIGS. 5A to 5B are cross sectional views explaining a method for manufacturing the sensor according to the first embodiment;

FIG. 9 is a cross sectional view showing a capacitance type angular rate sensor according to a second embodiment of the present invention;

FIG. 10 is a plan view showing a capacitance type angular rate sensor according to a third embodiment of the present invention.

DETAILED DESCRIPTION OF THE PREFERRED EMBODIMENTS

First Embodiment

A capacitance type semiconductor physical quantity sensor according to a first embodiment of the present invention is applied to a capacitance type angular rate sensor.

Figure 1:
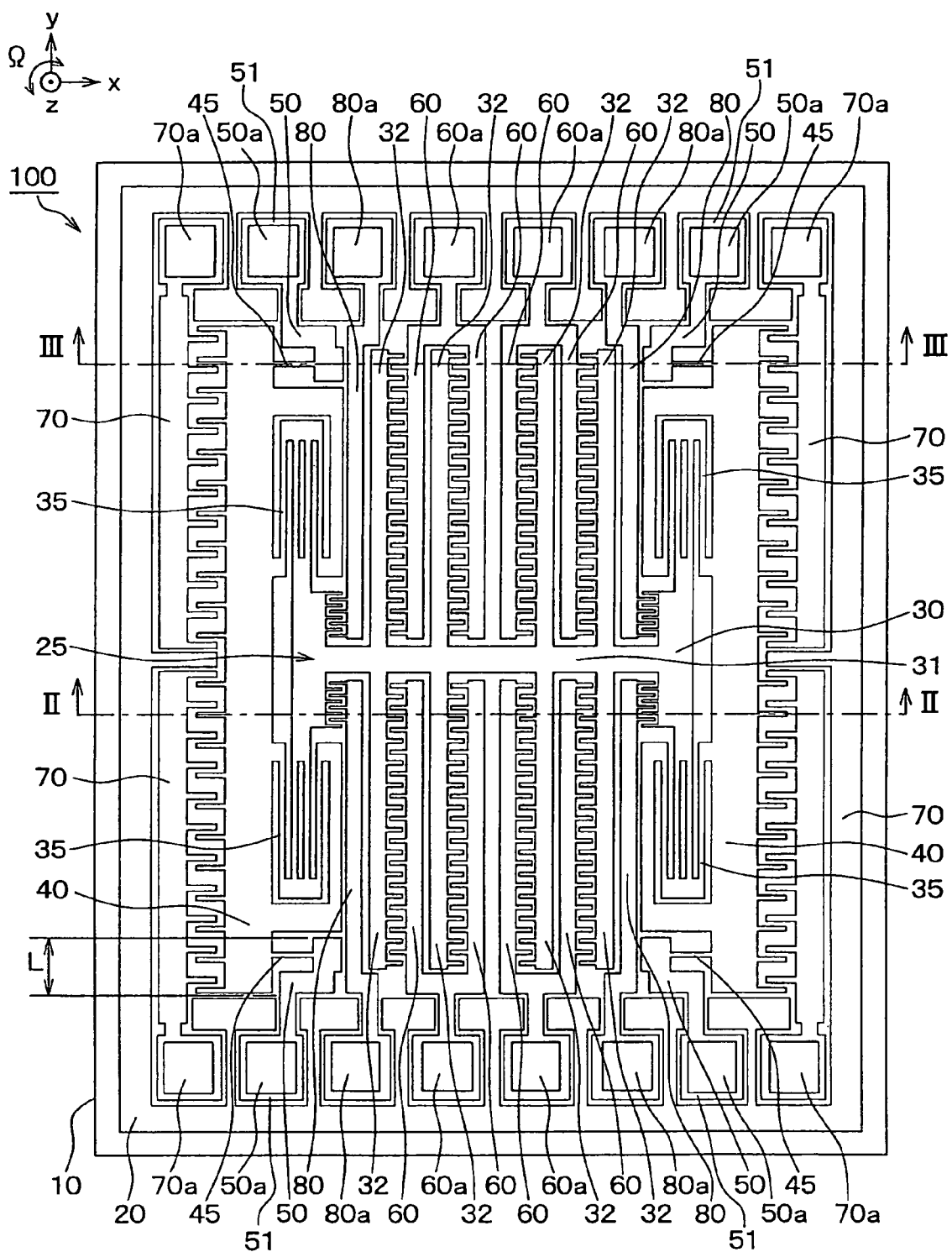
FIG. 1 is a plan view showing a capacitance type angular rate sensor according to a first embodiment of the present invention.

FIG. 1 is a plan view for schematically showing a capacitance type angular rate sensor 100 according to the first embodiment. Also, FIG. 2 is a sectional view for schematically indicating the capacitance type angular rate sensor 100, taken along a line II-II of FIG. 1. FIG. 3 is a sectional view for schematically showing the angular rate sensor 100, taken along a line III-III of FIG. 1.

[Structure]

This angular rate sensor 100 is made of a semiconductor substrate 10 such as a silicon substrate. Since trenches are formed in this semiconductor substrate 10 by employing the well-known semiconductor manufacturing technique such as an etching process, as indicated in FIG. 1, a frame unit 20 is segmented to be formed in an outer peripheral unit of this semiconductor substrate 10 and also, a movable electrode 25 and respective fixed electrodes 60, 70, 80, are segmented to be formed in an inner peripheral portion thereof. The movable electrode 25 contains vibrators 30 and 40.

As shown in FIG. 2, the semiconductor substrate 10 corresponds to a stacked layer substrate 10 which is manufactured by stacking semiconductor layers via an insulating layer 13 on a support substrate 11. Concretely speaking, this stacked layer substrate 10 corresponds to an SOI (silicon-on insulator) substrate which is manufactured by sandwiching an embedded insulating film 13 between a silicon substrate 11 and an SOI layer 12. The embedded oxide film 13 functions as the insulating layer 13. The silicon substrate 11 functions as the support substrate 11. The SOI layer 12 functions as the semiconductor layer 12.

Then, in the stacked layer substrate 10 functioning as this semiconductor substrate, since a trench etching process was carried out from the front surface of the SOI layer 12, the frame unit 20, the movable electrode 25, and the respective fixed electrodes 60 to 80, which are previously described and segmented, are formed with respect to the SOI layer 12.

As represented in FIG. 2, both the frame unit 20 and the respective fixed electrodes 60 to 80 among these structural units are supported via the insulating layer 13 by the silicon substrate 11 functioning as the support substrate so as to be fixed. Both the frame unit 20 and the respective fixed electrodes 60 to 80 correspond to fixed structural units which are fixed on the support substrate 11.

The movable electrode 25 is arranged by providing a drive-purpose vibrator 30, an angular rate detection-purpose vibrator 40, a drive beam 35 for coupling both the vibrators 30 and 40 to each other, and a detection beam 45 for coupling the angular rate detection-purpose vibrator 40 to the silicon substrate 11 functioning as the support substrate.

When a coupling relationship between the movable electrode 25 and the support substrate 11 is viewed, as represented in FIG. 2 and FIG. 3, there is no insulating layer 13 between the entire portion of the movable electrode 25 and the support substrate 11, but there is a gap. Thus, the movable electrode 25 is released via this gap from the support substrate 11.

Then, as shown in FIG. 1, as the entire portion of the movable electrode 25, each of the four detection beams 45 is coupled via a detection beam lead 50 to the silicon substrate 11 corresponding to the support substrate. In other words, this detection beam lead 50 corresponds to a coupling unit for coupling the movable electrode 25 to the support substrate 11.

Similar to the above-explained respective fixed electrodes 60 to 80 and frame unit 20, the detection beam lead 50 is supported via the insulating layer 13 to the silicon substrate 11 by a supporting unit 51 (see FIG. 1) having a rectangular shape (as viewed in plane) where a pad 50a (will be explained later) is formed.

Then, as shown in FIG. 3, a portion within the detection beam lead 50, which is bridged from a tip portion of the supporting unit 51 to the coupling unit with the detection beam 45 corresponds to such a portion that the insulating layer 13 is not present under this portion. This portion is released with the gap from the silicon substrate 11.

The drive-purpose vibrator 30 is constituted by providing a weight unit 31 and elongation units 32. This weight unit 31 is elongated along an "X" direction shown in FIG. 1. The elongation units 32 are elongated along a "Y" direction on both sides of this weight unit 31. Four sets of the elongation units 32 are provided on the upper side of the weight unit 31, and four sets of the elongation units 32 are provided on the lower side thereof, namely, eight sets of these elongation units 32 are provided in total.

Also, two sets of the angular rate detection-purpose vibrators 40 are provided on both out sides of the weight unit 31 of the drive-purpose vibrator 30 in the X direction (will be referred to as "first direction X" hereinafter) indicated in FIG. 1, and are formed in a narrow shape which is elongated along the Y direction (will be referred to as "second direction Y" hereinafter).

In this case, both edge portions of the weight unit 31 of the drive-purpose vibrator 30 are coupled via the drive beam 35 to the angular rate detection-purpose vibrator 40. As indicated in FIG. 1, the drive-purpose vibrator 30 is coupled to the angular rate detection-purpose vibrators 40 by four sets of the drive beams 35. Then, the angular rate detection-purpose vibrator 40 is coupled via the detection beams 45 with respect to the detection beam leads 50 corresponding to the coupling unit to the silicon substrate 11.

The movable electrode 25 is supported via four sets of the detection beam loads 50 by the silicon substrate 11 corresponding to the support substrate. Also, under this supporting condition, this movable electrode 25 is brought into such a condition that the movable electrode 25 is released via the gap from the silicon substrate 11, and is movable with respect to the silicon substrate 11.

The angular rate detection-purpose vibrator 40 is coupled via the detection beams 45 and the detection beam leads 50 to the silicon substrate 11 so as to be supported. Although the drive-purpose vibrator 30 is interposed both the angular rate detection-purpose vibrator 40 and the detection beams 45, this drive-purpose vibrator 30 is coupled via the detection beam leads 50 to the silicon substrate 11.

In this case, the drive beam 35 owns a degree of freedom along the first direction X. In this example, as represented in FIG. 1, the drive beam 35 owns a plurality of beams, and can be operated in a spring displaceable manner essentially only along the first direction X.

Also, the detection beam 45 owns a degree of freedom along the second direction Y. In this example, as shown in FIG. 1, the detection beam 45 is formed in such a beam shape which is elongated along the X direction, and can be operated in a spring displaceable manner essentially only along the second direction Y. It should be understood that a resonant frequency of the drive beam 35 is different from a resonant frequency of the detection beam 45.

Since the drive beam 35 and the detection beam 45 are constructed in the above manner, the drive-purpose vibrator 30 is supported with respect to the silicon substrate 11 corresponding to the support substrate under such a condition that this drive-purpose vibrator 30 can be displaced along the first direction X, whereas the angular rate detection-purpose vibrator 40 is supported with respect to the silicon substrate 11 under such a condition that this angular rate detection-purpose vibrator 40 can be displaced along the second direction Y which is intersected perpendicular to the first direction X. As a consequence, the movable unit 25 can be moved along such a direction parallel to the substrate plane of the silicon substrate 11.

Also, in each of the anchor units 50 to which the detection beam 45 of the movable electrode 25 is coupled, the pad 50a for detecting the angular rate is formed on a supporting unit 51 corresponding to the fixing unit to the silicon substrate 11.

While this angular rate detection-purpose pad 50a is electrically connected to the detection beam 45, a predetermined voltage may be applied via this pad 50a with respect to both the drive-purpose vibrator 30 and the angular rate detection-purpose vibrator 40.

Also, as shown in FIG. 1, a drive-purpose fixed electrode 60 fixed on the silicon substrate 11 is arranged in an opposite manner on a side surface of each of the elongation units 32 of the drive-purpose vibrator 30. Then, at such portions that the elongation unit 32 of the drive-purpose vibrator 30 is located opposite to the drive-purpose fixed electrode 60, comb teeth-shaped units are provided in such a manner that these comb teeth-shaped units are projected from opposite planes thereof to the counter party in a comb teeth form, and the comb teeth thereof are meshed with each other.

Each of the drive-purpose fixed electrodes 60 is electrically connected to the drive-purpose pad 60a provided in the vicinity of the frame unit 20. Then, a drive voltage may be applied through this drive-purpose pad 60a to the drive-purpose fixed electrode 60.

Also, as indicated in FIG. 1, angular rate detection-purpose fixed electrodes 70 fixed to the silicon substrate 11 are arranged on the outer side surfaces of the angular rate detection-purpose vibrator 40 in such a manner that the angular rate detection-purpose fixed electrode 70 are located opposite to each other. In this case, two sets of the angular rate detection-purpose fixed electrodes 70 are provided in an upper and lower direction with respect to one vibrator of the angular rate detection-purpose vibrators 40. This angular rate detection-purpose fixed electrode 70 corresponds to a fixed electrode for detecting a physical quantity.

Then, at such portions that the angular rate detection-purpose vibrator 40 is located opposite to the angular rate detection-purpose fixed electrode 70, comb teeth-shaped units are provided in such a manner that these comb teeth-shaped units are projected from opposite planes thereof to the counter party in a comb teeth form, and the comb teeth thereof are meshed with each other.

Each of the angular rate detection-purpose fixed electrodes 70 is electrically connected to an angular rate detection-purpose pad 70a provided in the vicinity of the frame unit 20. Then, a potential of the angular rate detection-purpose fixed electrode 70 through this angular rate detection-purpose pad 70a can be measured.

Also, as shown in FIG. 1, the vibration detection-purpose fixed electrodes 80 fixed to the silicon substrate 11 are arranged on the drive-purpose vibrator 30 in such a manner that the vibration detection-purpose fixed electrodes 80 are located opposite to the drive-purpose vibrator 30. In this case, two sets of these vibration detection-purpose fixed electrodes 80 are provided along the upper and lower direction at positions outside the drive-purpose fixed electrode 60, namely four sets of these vibration detection-purpose fixed electrodes 80 are provided in total.

Then, at such portions that the drive-purpose vibrator 30 is located opposite to the vibration detection-purpose fixed electrodes 80, comb teeth-shaped units are provided in such a manner that these comb teeth-shaped units are projected from opposite planes thereof to the counter party in a comb teeth form, and the comb teeth thereof are meshed with each other.

Each of the vibration detection-purpose fixed electrodes 80 is electrically connected to a vibration detection-purpose pad 80a provided in the vicinity of the frame unit 20. Then, a potential of the vibration detection-purpose fixed electrode 80 through this vibration detection-purpose pad 80a can be measured.

While the frame unit 20 is constituted in such a manner that this frame unit 20 surrounds both the movable electrode 25 containing the vibrators 30 and 40 and the respective fixed electrodes 60, 70, 80, this frame unit 20 is maintained via a pad (not shown) and the like to the GND potential. Also, the respective pads are made of aluminium, or the like.

The angular rate sensor 100, according to this first embodiment mode, is arranged by employing the movable electrode 25 and the fixed electrodes 60, 70, and 80. The movable electrode 25 is coupled on the silicon substrate 11 corresponding to the support substrate under such a condition that this movable electrode 25 is movable with respect to the silicon substrate 11. The fixed electrodes 60, 70, and 80 are coupled on the silicon substrate 11 under such a condition that these fixed electrodes 60, 70, 80 are fixed to the silicon substrate 11 and are arranged opposite to the movable electrode 25. The angular rate sensor 100 owns a feature point as to the below-mentioned structural units.

That is, as shown in FIG. 2, and FIG. 3, in this angular rate sensor 100, the entire portion of the movable electrode 25, namely, the respective vibrators 30, 40, and the like are positioned opposite to each other on the silicon substrate 11 functioning as the support substrate under such a condition that these vibrators 30, 40, and the like are positioned along a direction apart from the silicon substrate 11 rather than the fixed electrodes 60, 70, 80, while the respective vibrators 30 and 40 are positionally shifted with respect to the fixed electrodes 60 to 80.

This featured structure is realized by such a condition that the detection beam lead 50 for coupling the entire portion of the movable electrode 25 to the silicon substrate 11 is cambered along a direction apart from the silicon substrate 11 and directed from a lead portion thereof on the side of the supporting unit 51 to a coupling side thereof with respect to the movable electrode 25.

While the supporting units 51 in the four detection beam leads 50 are employed as the fixed units, the entire portion of the movable electrode 25 is floated from the silicon substrate 11 rather than the fixed electrodes 60 to 80 toward the upward direction and located substantially parallel to this silicon substrate 11.

In other words, the movable electrode 25 is formed in such a manner that this movable electrode 25 is floated from the silicon substrate 11 toward the upper direction and located substantially parallel to this silicon substrate 11 in order to achieve such a condition that this movable electrode 25 is located higher than the thickness of the embedded oxide film 13 corresponding to the insulating layer. The height of the gap between the movable electrode 25 and the silicon substrate 11 is made larger than the thickness of the embedded oxide film 13.

A compression stress layer 90 is provided on the front surface of this detection beam lead 50. This compression stress layer 90 corresponds to a layer which generates larger compression stress, as compared with compression stress of the SOI layer 12 which constitutes the movable electrode 25 and the fixed electrodes 60 to 80.

If such a layer capable of generating large compression stress is available as the compression stress layer 90, then there is no specific limitation to this layer. Concretely speaking, such an impurity diffusion layer which is formed on the front surface of the SOI layer 12 by executing an ion implantation, a thermal diffusion, or the like may be employed as the compression stress layer 90. For example, an $N^+$ diffusion layer may be employed as this compression stress layer 90. The Inventors of the present invention could find out through experiments such a fact that this $N^+$ diffusion layer may be applied as the compression stress layer 90.

Also, as this compression layer 90, a thermal oxide film which is formed by thermally oxidizing the front surface of the SOI layer 12, polycrystal silicon which is formed by way of a CVD method, or the like, or a silicon nitride film which is formed by way of a CVD method may be employed. Since LP-SiN which is formed by way of a low pressure plasma method owns large compression stress, this LP-SiN is preferable as the silicon nitride film.

[Manufacturing Method]

Referring now to FIG. 4A to FIG. 5B, a description is made of a method for manufacturing the angular rate sensor 100 according to this first embodiment mode. FIGS. 4A to 5B are stage diagrams for indicating the manufacturing method for the angular rate sensor 100, and sectional views for indicating the angular rate sensor 100 corresponding to FIG. 3.

First, as indicated in FIG. 4A, such a stacked layer substrate 10 made of the above-explained SOI substrate is prepared as the stacked layer substrate 10 in which the semiconductor layer 12 is stacked via the insulating layer 13 on the support substrate 11. This SOI substrate corresponds to such an adhered SOI wafer that the thickness of the SOI layer 12 can be relatively easily controlled to become a desirable thickness as the semiconductor layer where the movable electrode 25 and the fixed electrodes 60 to 80 are formed.

For instance, as this SOI wafer, the following SOI wafer may be employed which can be generally manufactured in a relatively low price: A thickness of the embedded oxide film 13 is 2 to 3 μm; a thickness of the SOI layer 12 is 10 to 30 μm; and a thickness of the silicon substrate 11 is approximately 400 to 650 μm.

In the SIO wafer, namely, in the stacked layer substrate 10, since the movable structural body made of the SOI layer 12 is released from the silicon substrate 11, the embedded oxide film 13 functions as the sacrifice layer.

Next, as shown in FIG. 4B and FIG. 4C, the compression stress layer 90 is formed on such a portion which constitutes the coupling unit for coupling the movable electrode 25 to the silicon substrate 11 within the SOI layer 12 functioning as the semiconductor layer in the stacked layer substrate 10, namely, on the front surface of the portion which constitutes the detection beam lead 50 (compression stress layer forming step).

In this case, this manufacturing step shows such a case that an $N^+$ diffusion layer is formed as the compression stress layer 90. As indicated in FIG. 4B, a mask 110 is formed on the front surface of the SOI layer 12 in the stacked layer substrate 10. This mask 110 has an opening portion of a portion where the compression stress layer 90 should be formed. In this case, it is so assumed that the mask 110 is made of a thermal oxide film.

Subsequently, as indicated in FIG. 4C, an $N^+$ diffusion process is carried out. The method for forming the $N^+$ diffusion layer may be realized by way of a general-purpose semiconductor manufacturing method, namely, a thermal diffusion method and an ion implantation method. Then, after the compression stress layer 90 made of the $N^+$ diffusion layer is formed, the mask 110 made of the thermal oxide film is removed.

Although not shown in these drawings, the compression stress layer 90 made of the $N^+$ diffusion layer is formed, and thereafter, the pads made of aluminium, or the like are formed, and the electrodes for deriving signals are formed.

Next, as shown in FIG. 5A, trenches 120 are formed with respect to the SOI layer 12 corresponding to the semiconductor layer (trench forming step). The trenches 120 are reached from the front surface of this SOI layer 12 and segment the patterns as to the movable electrode 25 and the fixed electrodes 60 to 80.

While the embedded oxide film 13 is employed as an etching stopper, the trenches 120 are formed in the SOI layer 12. The widths of the trenches 120 are selected to be on the order of 2 to 3 μm among the movable electrode 25 and the fixed electrodes 60 to 80, which are used to detect changes in electrostatic capacitances.

Although this trench etching-purpose mask is not illustrated in the drawings, a general-purpose resist and a general-purpose oxide film may be employed. Also, in the trench etching process, a manufacturing apparatus capable of vertically etching is employed. For instance, the trench process operation may be carried out by employing such a manufacturing apparatus as ICP (Ion Coupled Plasma).

Next, after the trench etching-purpose mask is removed, as represented in FIG. 5B, a release step is carried out.

In this release step, since the embedded oxide film 13 functioning as the insulating layer is removed, the movable electrode 25 is released from the silicon substrate 11 functioning as the support substrate. While the embedded oxide film 13 is used as the sacrifice layer, the movable electrode 25 is released, so that this embedded oxide film 13 is etched by employing HF gas so as to be removed.

In this step, since this etching process corresponds to an isotropic etching process, a plurality of etching holes may be alternatively formed in the trench forming step with respect to the weight unit 31 and the like, which own widths which can be hardly release-etched. In accordance with this alternative method, even such a portion having a wide width may be readily release-etched.

Then, in this release step, when the releasing process of the movable electrode 25 is accomplished, the four detection beam leads 50 are cambered along the direction apart from the silicon substrate 11 due to the compression stress which is generated in the compression stress layer 90 made of the N$^+$ diffusion layer.

Since the movable electrode 25 is lifted up along the direction apart from the silicon substrate 11 corresponding to the support substrate due to the camber of this detection beam lead 50, such a gap (clearance) which is higher than the height of the gap produced by the embedded oxide film 13 may be secured in the movable electrode 25. Thus, the angular rate sensor 100 may be accomplished.

In the manufacturing method, the trench forming step is carried out after the compression stress layer forming step. Alternatively, if possible, then the trench forming step may be carried out so as to pattern both the movable electrode 25 and the fixed electrodes 60 to 80, and thereafter, the compression stress layer forming step may be carried out.

In this alternative case, in the compression stress layer forming step, in such a case that an N$^+$ diffusion layer functioning as the compression stress layer 90 is formed on the surface of the detection beam 50 under a predetermined condition, a height of a gap between the movable electrode 25 and the silicon substrate 11 may be controlled to become a desirable height by a length "L" (refer to FIG. 1) of the detection beam lead 50.

For instance, in such a case that an N$^+$ diffusion process for depositing phosphorus (P) is carried out when the compression stress layer 90 is formed, the deposition process is carried out at a temperature of 1000° C. for approximately 20 minutes, and thereafter, a slumping process is carried out at a temperature of 1000° C. for approximately 20 minutes. As a result, an N$^+$ diffusion layer is obtained, the surface resistibility of which is approximately 8 Ω/□.

In this case, in accordance with the investigation made by the Inventors of the present invention, in the case that the length "L" of each of the detection beam leads 50 is selected to be 0.4 mm, such an experimental result could be found out. That is, a camber of approximately 1 μm was obtained in the detection beam lead 50.

Since the N$^+$ diffusion layer is employed as the compression stress layer 90, the dimension of the gap between the movable electrode 25 and the silicon substrate 11 can be sufficiently increased with respect to the clearance which depends upon only the thickness of the embedded oxide film 13.

When the N$^+$ diffusion layer is formed as the compression stress layer 90, although the SOI layer 12 corresponding to the semiconductor layer may be made of either an N type semiconductor layer or a P type semiconductor layer, the SOI layer 12 is made of an N$^-$ silicon layer. Also, it is conceivable that an impurity diffusion layer other than the N$^+$ diffusion layer may be employed as the compression stress layer 90.

Figure 6:
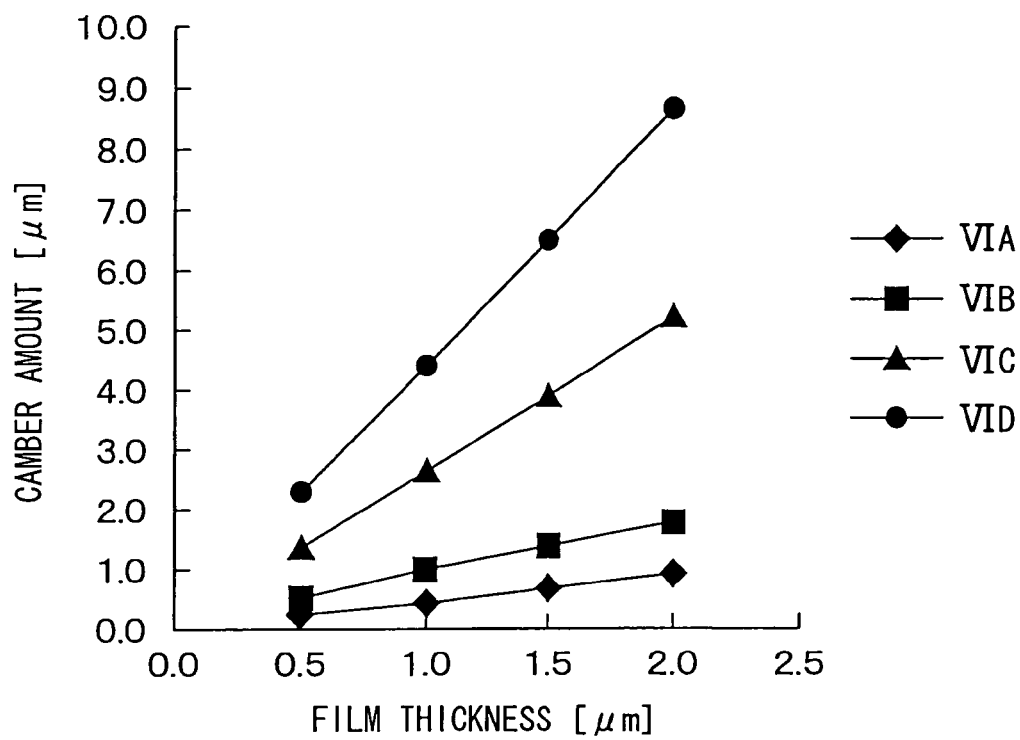
FIG. 6 is a graph showing a relations hip between film thickness and camber amount in a thermal oxidation film, according to the first embodiment.

Also, in such a case that a film capable of producing large compression stress other than the N$^+$ diffusion layer, for example, a thermal oxide film is formed as the compression stress layer 90, a calculation result indicated in FIG. 6 is obtained. FIG. 6 is a graphic diagram for representing a relationship between a film thickness "d" of a thermal oxide film and a camber amount "x" of a detection beam lead when film stress "δ" is changed in the case that the thermal oxide film is formed as the compression stress layer 90. A line VIA represents a case where a film stress of 50 MPa is applied, a line VIB represents a case where a film stress of 100 MPa is applied, a line VIC represents a case where a film stress of 300 MPa is applied, and a line VID represents a case where a film stress of 500 MPa is applied.

A calculation formula as to the camber amount "x" of the detection beam lead is indicated in the below-mentioned formula No. 1:

$$x=3\times(L\times0.001)^2\times d\times0.000001\times(1-v)/\{E\times 1000000000\times(D\times0.000001)^2\}\times(\delta\times1000000)\times 1000000 \quad \text{(Formula No. 1)}$$

In the formula No. 1, a length of a detection beam lead defined as L (mm); a thickness of a thermal oxide film as a compression stress layer defined as d (μm); Poisson's ratio of an SOI layer defined as v; Young's modulus of the SOI layer defined as E (GPa); a thickness of the SOI layer defined as D(μm); and film stress of the thermal oxide film defined as δ (MPa).

Now, as one example of the calculation, when the below-mentioned conditions are given, the camber amount "x" of the detection beam lead becomes 1.3 μm. These conditions are given as follows: the length "L" of the detection beam lead is equal to 0.4 mm; the thickness "d" of the thermal oxide film is equal to 0.5 μm; the Poisson's ratio "v" of the SOI layer is equal to 0.3; the Young's modulus "E" is equal to 170 GPa; the thickness "D" of the SOI layer is equal to 15 μm; and the film stress "δ" of the thermal oxide film is equal to 300 MPa which corresponds to a general magnitude thereof.

Also, in FIG. 6, camber amounts "x" of the detection beam lead are represented in such a case that the film stress is equal to 50 MPa, 100 MPa, and 500 MPa other than 300 MPa. In any of these cases, in connection with an increase of the film thickness of the thermal oxide film, the camber amount is also increased in a direct proportional manner.

Similarly, an actual trend resembles the trend indicated in this graph of FIG. 6. While the relationship between the film thickness of this thermal oxide film and the camber amount of the detection beam lead is utilized, a camber amount of the detection beam lead 50 may be predicted and may be controlled.

Since the thermal oxide film is employed as the compression stress layer 90, the dimension of the gap between the movable electrode 25 and the silicon substrate 11 can be sufficiently increased with respect to the clearance which depends upon only the thickness of the embedded oxide film 13.

[Operations]

Next, operations of the angular rate sensor 100 will now be explained.

The angular rate sensor 100 is driven by applying a desirable drive voltage with respect to the drive-purpose pad 60a to which the drive-purpose fixed electrode 60 is electrically connected.

When the desirable drive voltage is applied to the drive-purpose pad 60a, electrostatic attracting force is produced based upon a capacitance formed between the drive-purpose fixed electrode 60 and the elongation unit 32 of the drive-purpose vibrator 30 in response to a periodic variation of an AC component of the drive voltage. As a result, the drive beam 35 is flexed, so that the drive-purpose vibrator 30 is vibrated along the first direction "X", namely is caused for drive vibrations.

At this time, an overlap amount between the comb teeth-shaped unit formed in the vibration detection-purpose fixed electrode 80 and the comb teeth-shaped unit formed in the drive-purpose vibrator 30 is varied along the direction parallel to the substrate plane of the silicon substrate 11 functioning as the support substrate in response to this drive vibration. As a result, the capacitance which is formed by these comb teeth-shaped units is changed.

A magnitude of this drive vibration can be monitored by measuring this capacitance change based upon a potential of the vibration detection-purpose pad 80a to which the vibration detection-purpose fixed electrode 80 is connected. The drive voltage is feedback-controlled in response to the magnitude of the drive vibration in order that the magnitude of the drive vibration becomes a desirable value.

Under such a condition that this drive vibration is carried out, when an angular rate "Ω" around a rotation axis "Z" which is perpendicular to both the first direction "X" and the second direction "Y" is inputted, Coriolis force is generated, and thus, the entire portion of the movable electrode 25 containing both the drive-purpose vibrator 30 and the angular rate detection-purpose vibrator 40 performs a detection vibration along the second direction "Y" due to a flexure of the detection beam 45.

As a result, the interval between the comb teeth-shaped unit provided in the angular rate detection-purpose vibrator 40 and the comb teeth-shaped unit provided in the angular rate detection-purpose fixed electrode 70 is changed along the direction parallel to the substrate plane of the silicon substrate 11 functioning as the support substrate, so that the capacitance which is formed by these comb teeth-shaped units is changed. Then, since the potential of the angular rate detection-purpose fixed electrode 70 is changed in connection with this change of the capacitance, the angular rate "Ω" can be detected by measuring this potential.

The above basic detection operation executed in this angular rate sensor 100, namely, the detecting operation as to the angular rate "Ω" around the rotation axis "Z."

In this case, in the angular rate sensor 100, the movable electrode 25 is positionally shifted with respect to the fixed electrodes 60 to 80 and is located opposite to these fixed electrodes 60 to 80 on the silicon substrate 11 corresponding to the support substrate under such a condition that this movable electrode 25 is positioned along the direction apart from the silicon substrate 11 rather than the fixed electrodes 60 to 80.

Apparently, this positional relationship may be similarly applied to such a relationship between the angular rate detection-purpose fixed electrode 70 corresponding to the physical quantity detection-purpose fixed electrode among the fixed electrodes 60 to 80, and the angular rate detection-purpose vibrator 70 corresponding to the portion of the movable electrode 25 located opposite thereto.

In the angular rate sensor 100, as shown in FIG. 2 and FIG. 3, the angular rate detection-purpose vibrator 40 is positionally shifted from the angular rate detection-purpose fixed electrode 70 along the direction "Z" of the rotation axis and is located opposite thereto.

As a consequence, the opposite area defined between the comb teeth-shaped unit provided in the angular rate detection-purpose vibrator 40 and the comb teeth-shaped unit provided in the angular rate detection-purpose fixed electrode 70 is decreased by this shift component, and thus, the electrostatic capacitance value produced by both the comb teeth-shaped units which are located opposite to each other is also decreased.

However, since the adhered SOI wafer in which the thickness of the SOI layer 12 can be relatively easily controlled is employed as the stacked substrate 10, if the thickness of the SOI layer 12 is processed to become a desirable thickness, for instance, if the thickness of the SOI layer 12 is made thick in order to obtain a desirable electrostatic capacitance value, then the opposite area may be simply increased.

[Effects]

Next, the effects will now be described.

The manufacturing method of the semiconductor angular rate sensor 100 is featured by employing the below-mentioned respective manufacturing steps, while the semiconductor angular rate sensor 100 is equipped with: the movable electrode 25 coupled on the silicon substrate 11 under such a condition that the movable electrode 25 is movable with respect to the silicon substrate 11; and the fixed electrodes 60, 70, 80, which are coupled on the silicon substrate 11 under such a condition that these fixed electrodes 60, 70, 80 are arranged opposite to the movable electrode 25, and the semiconductor angular rate sensor 100 detects the angular rate based upon the changes in the capacitances between the movable electrode 25 and the fixed electrodes 60 to 80 when the angular rate is applied thereto.

That is, the manufacturing method is provided with:

the step for preparing the stacked layer substrate 10 where the SOI layer 12 is stacked via the embedded oxide film 13 on the silicon substrate 11 (refer to FIG. 4A);

the compression stress layer forming step which forms the compression stress layer 90 for generating the compression force on the surface of the portion which constitutes the detection beam lead 50 corresponding to the coupling unit for coupling the movable electrode 25 to the silicon substrate 11 within the SOI layer 12 (refer to FIG. 4B and FIG. 4C); and the trench forming step for forming the trenches 120 which are reached from the front surface of the SOI layer 12 to the embedded oxide film 13 and segment the patterns of both the movable electrode 25 and the fixed electrodes 60 to 80 with respect to the SOI layer 12 (refer to FIG. 5A).

The manufacturing method is further provided with the release step by which the movable electrode 25 is released from the silicon substrate 11 by removing the embedded oxide film 13, and the detection beam lead 50 corresponding to the coupling unit, namely, the portion where the compression stress layer 90 within the SOI layer 12 is formed is cambered along the direction apart from the silicon substrate 11 by the compression stress. This manufacturing method is featured by executing the above respective steps.

When the movable electrode 25 is released from the silicon substrate 11 by removing the embedded oxide film 13, the detection beam lead 50 corresponding to the coupling unit for coupling the movable electrode 25 to the silicon substrate 11 is cambered along the direction apart from the silicon substrate 11 by the compression stress produced in the compression stress layer 90. As a result, the distance between the movable electrode 25 and the silicon substrate 11 is increased.

In accordance with the manufacturing method of this embodiment, even if the thickness of the embedded oxide film 13 corresponding to the sacrifice layer is not made thick, the gap between the movable electrode 25 and the silicon substrate 11 becomes wide, so that even when the foreign matter is mixed into this gap, the movable electrode 25 can hardly receive any interference from the foreign matter, and the normal operation of the movable electrode 25 can be hardly disturbed.

As a consequence, in the capacitance type angular rate sensor 100 manufactured by forming both the movable electrode 25 and the fixed electrodes 60 to 80 located opposite to the movable electrode 25 on the silicon substrate 11, it is possible to suppress lowering of the production yield, which is caused by mixing the foreign matters into the space between the movable electrode 25 and the silicon substrate 11, while the thickness of the embedded oxide film 13 corresponding to the sacrifice layer is not made thick.

Also, the manufacturing method is featured by employing as the compression stress layer 90, a layer made of an impurity diffusion layer, for example, an $N^+$ diffusion layer, a thermal oxide film, polycrystal silicon, or a silicon nitride film.

Further, such an angular rate sensor 100 having the following feature may be provided. That is, in the semiconductor angular rate sensor 100 equipped with: the movable electrode 25 coupled on the silicon substrate 11 under such a condition that the movable electrode 25 is movable with respect to the silicon substrate 11; and the fixed electrodes 60, 70, 80, which are coupled on the silicon substrate 11 under such a condition that these electrodes 60, 70, 80 fixed on the silicon substrate 11 are arranged opposite to the movable electrode 25, the semiconductor angular rate sensor 100 detects the angular rate based upon the changes in the capacitances between the movable electrode 25 and the fixed electrodes 60 to 80 when the angular rate is applied thereto; and the movable electrode 25 is positionally shifted from the fixed electrodes 60 to 80 and located opposite to these fixed electrodes 60 to 80 over the silicon substrate 11 under such a condition that the movable electrode 25 is positioned along the direction apart from the silicon substrate 11 rather than the fixed electrodes 60 to 80.

The angular rate sensor 100 having such a feature point may be properly manufactured by the manufacturing method. The effects of this angular rate sensor 100 may be achieved as follows: That is, it is possible to suppress lowering of the production yield, which is caused by mixing the foreign matters into the space between the movable electrode 25 and the silicon substrate 11, while the thickness of the embedded oxide film 13 corresponding to the sacrifice layer is not made thick.

Also, this sensor 100 can properly detect a physical quantity along such a direction perpendicular to the substrate plane of the silicon substrate 11, namely a thickness direction of the silicon substrate 11, i.e., the "Z" direction of the rotation axis. Concretely speaking, a description is made of sensor operations in the case that acceleration applied along the "Z" direction of the rotation axis is detected with reference to FIG. 7 and FIG. 8.

Figure 7:
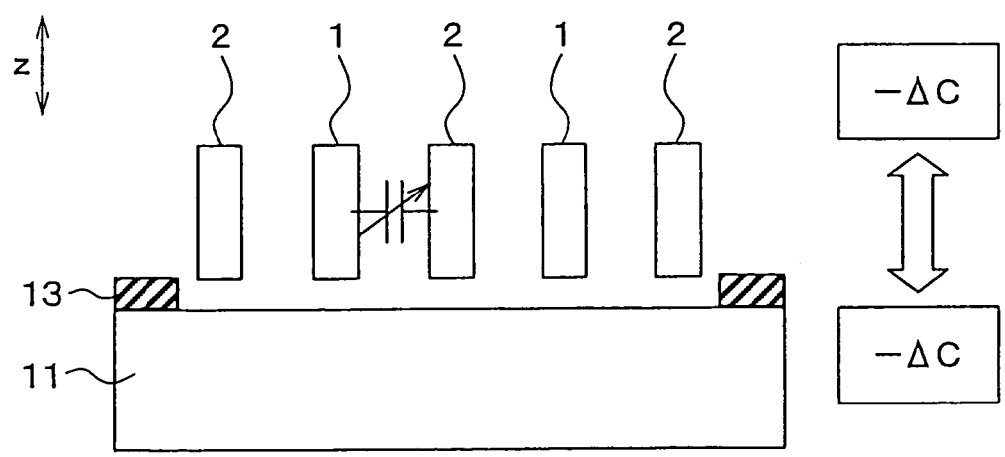
FIG. 7 is a cross sectional view showing a capacitance type physical quantity sensor as a comparison of the first embodiment.

FIG. 7 is a diagram for representing a schematic sectional structure of a general-purpose conventional capacitance type semiconductor physical quantity sensor. FIG. 8 is a diagram for indicating a schematic sectional structure of the angular rate sensor 100, namely an explanatory diagram for explaining detecting operations of this angular rate sensor 100 in the case that acceleration applied to the "Z" direction of the rotation axis is detected.

As shown in FIG. 7, in the conventional semiconductor physical quantity sensor, both plural movable electrodes 1 and plural fixed electrodes 2 are formed on a support substrate 11, while the fixed electrodes 12 detect the physical quantity and are located opposite to the movable electrodes 1. These movable electrodes 1 and fixed electrodes 2 are positioned at the same height equivalent to such a thickness height which is defined from the support substrate 11 to the insulating layer 13. These movable electrodes 1 and fixed electrodes 2 are located opposite to each other within the same plane.

As a result, when the acceleration of the thickness direction of the support substrate 11, namely the "z" direction is applied, even in such a case that the movable electrodes 1 are displaced along a direction (namely, upper direction shown in FIG. 7) apart from the support substrate 11 and also displaced along a direction (namely, lower direction shown in FIG. 7) close to the support substrate 11, the opposite area between the movable electrodes 1 and the fixed electrode 2 is decreased, and thus, the capacitance change is shifted to a minus value ($-\Delta C$), namely, the capacitance value is decreased.

In the general-purpose conventional capacitance type semiconductor physical quantity sensor, although the degree of the capacitance change between the movable electrodes 1 and the fixed electrodes 2 can be detected, the increasing/decreasing directions of this capacitance change cannot be grasped. As a result, the direction of the displacement of the movable electrodes 1 along the thickness direction of the support substrate 11 cannot be judged. Namely, the direction of the applied acceleration cannot be judged.

To the contrary, in the angular rate sensor 100 of this first embodiment mode, the movable electrode 25 is positionally shifted from the fixed electrodes 60 to 80 and located opposite to these fixed electrodes 60 to 80 over the silicon substrate 11 under such a condition that the movable electrode 25 is positioned along the direction apart from the silicon substrate 11 rather than the fixed electrodes 60 to 80.

Figure 8A:
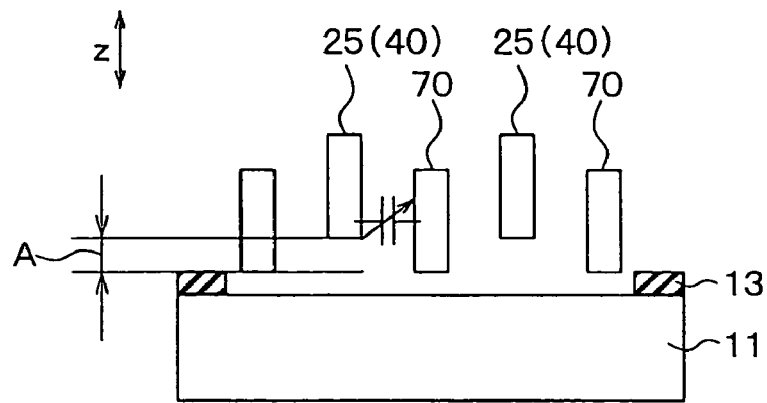
FIGS. 8A to 8C are cross sectional views explaining an operation of the angular rate sensor according to the first embodiment.

This condition implies the following fact. That is, as indicated in FIG. 8A, under such a condition that the acceleration along the "z" direction is not applied, the portions for detecting the angular rate in the movable electrode 25 and the fixed electrodes 60 to 80 are shifted by a shifting width "A", namely, both the angular rate detection-purpose vibrator 40 and the angular rate detection-purpose fixed electrode 70 are shifted by this shifting width "A."

Figure 8B:
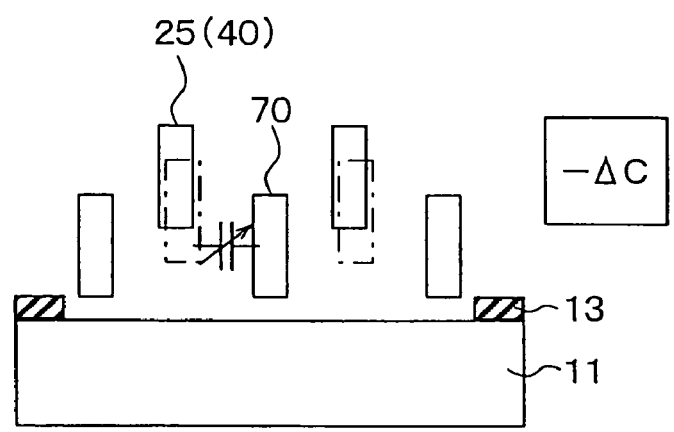

As a consequence, as indicated in FIG. 8B, when the acceleration is applied along the thickness direction of the support substrate 11, namely the "Z" direction, and thus, the movable electrode 25 is displaced along the direction (upper direction shown in FIG. 8) apart from the support substrate 11, the opposite area between the angular rate detection-purpose vibrator 40 and the angular rate detection-purpose fixed electrode 70 is decreased.

This decreased area corresponds to such a fact that the capacitance between both the electrode 40 (25) and the electrode 70 is decreased. Namely, this capacitance change is shifted to the minus value ($-\Delta C$).

Figure 8C:
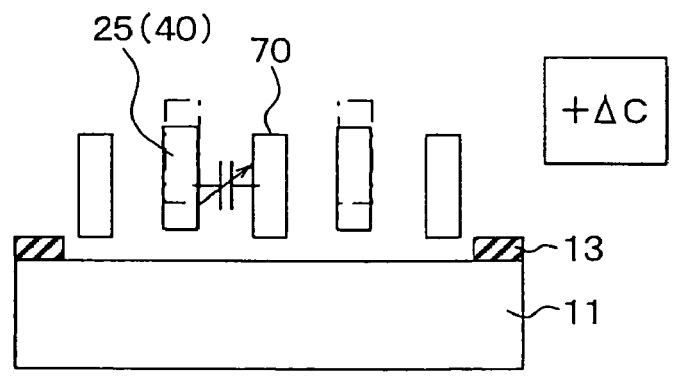

On the other hand, as shown in FIG. 8C, when the acceptation is applied along the "Z" direction, and thus, the movable electrode 25 is displaced along the direction (lower direction shown in FIG. 8) close to the support substrate 11, the opposite area between the angular rate detection-purpose vibrator 40 and the angular rate detection-purpose fixed electrode 70 is increased.

This increased area corresponds to such a fact that the capacitance between both the electrode 40 (25) and the electrode 70 is increased. Namely, this capacitance change is shifted to the plus value ($+\Delta C$).

Since the increasing/decreasing directions of the capacitance between the angular rate detection-purpose vibrator 40 and the angular rate detection-purpose fixed electrode 70, the angular rate sensor 100 can detect both the displacement direction and the magnitude of the displacement as to the movable electrode 25 along the thickness direction of the support substrate, namely the "Z" direction of the rotation axis in the proper manner, namely can detect both the direction and the magnitude of the applied acceleration in the proper manner.

In accordance with the angular rate sensor 100, it is possible to suppress lowering of the production yield, which is caused by mixing the foreign matters into the space between the movable electrode 25 and the silicon substrate 11, while the thickness of the embedded oxide film 13 corresponding to the sacrifice layer is not made thick. In addition, this angular rate sensor 100 can properly detect the physical quantity along the direction perpendicular to the substrate plane of the silicon substrate 11, namely the thickness direction of this silicon substrate 11, while the conventional capacitance type semiconductor physical quantity sensor could not detect such a physical quantity along the thickness direction of the silicon substrate 11.

In this case, as to the angular rate sensor 100, a further featured point is given as follows. That is, while the compression stress layer 90 is formed on the front surface of the detection beam lead 50 corresponding to the coupling unit for coupling the movable electrode 25 to the silicon substrate 11, since the detection beam lead 50 is cambered along the direction apart from the silicon substrate 11, the movable electrode 25 is positionally shifted with respect to the fixed electrodes 60 to 80 and is located opposite to these fixed electrodes 60 to 80.

Also, the angular rate sensor 100 is featured by employing as the compression stress layer 90, a layer made of an impurity diffusion layer, for example, an N$^+$ diffusion layer, a thermal oxide film, polycrystal silicon, or a silicon nitride film.

Second Embodiment

FIG. 9 is a diagram for schematically showing a sectional structure of a capacitance type angular rate sensor 200 according to a second embodiment of the present invention.

A plane structure of the angular rate sensor 200 is made similar to the plane structure shown in FIG. 1. FIG. 9 represents the angular rate sensor 200 by way of the sectional view shown in FIG. 2, namely, such a sectional view corresponding to the sectional view taken along the line II-II in FIG. 1.

In the angular rate sensor 100 shown in FIG. 1 to FIG. 3, the substantially entire portions of the fixed electrodes 60, 70, 80 are supported via the embedded oxide film 13 by the silicon substrate 11 to be fixed thereon (refer to FIG. 2 and FIG. 3).

To the contrary, in the angular rate sensor 200, the fixed electrodes 60 to 80 are supported via the embedded oxide film 13 at respective portions which are located in the peripheral unit of the silicon substrate 11, at portions where the pads 60a to 80a are formed. Then, the respective fixed electrodes 60 to 80 are brought into cantilever conditions at this supporting unit.

As indicated in FIG. 9, a portion of the drive-purpose fixed electrode 60 which is located opposite to the comb teeth-shaped unit of the elongation unit 32 of the drive-purpose vibrator 30 corresponding to the movable electrode 25, a portion of the angular rate detection-purpose fixed electrode 70 which is located opposite to the comb teeth-shaped unit of the angular rate detection-purpose vibrator 40, and the portion of the vibration detection-purpose fixed electrode 80 which is located opposite to the drive-purpose vibrator 30 are brought into floating conditions, while the embedded oxide film 13 is not present between these portions and the silicon substrate 11.

The angular rate sensor 200 is featured by that the fixed electrodes 60 to 80 are coupled under such a condition that these fixed electrodes 60 to 80 are supported by the silicon substrate 11 corresponding to the support substrate in the cantilever manner.

Also, a method for manufacturing the angular rate sensor 200 is realized by executing a step for preparing the stacked layer substrate 10, a compression stress layer forming step, a trench forming step, and a release step, which is similar to the above-described manufacturing method of the first embodiment mode.

In this manufacturing method, since the fixed electrodes 60 to 80 are supported in the cantilever manner, the embedded oxide film 13 under the fixed electrodes 60 to 80 is removed by performing an etching process in order to realize this cantilever condition in the release step.

In this second embodiment mode, the detection beam lead 50 is cambered by the compression stress along the direction apart from the silicon substrate 11 in the release step. The angular rate sensor 200 indicated in FIG. 9 can be manufactured in a proper manner.

Then, in the capacitance type angular rate sensor 200 manufactured by forming both the movable electrode 25 and the fixed electrodes 60 to 80 located opposite to the movable electrode 25 on the silicon substrate 11, it is possible to suppress lowering of the production yield, which is caused by mixing the foreign matters into the space between the movable electrode 25 and the silicon substrate 11, while the thickness of the embedded oxide film 13 corresponding to the sacrifice layer is not made thick.

Also, the movable electrode 25 is positionally shifted from the fixed electrodes 60 to 80 and is located opposite to these fixed electrodes 60 to 80 under such a condition that this movable electrode 25 is positioned along the direction apart from the silicon substrate 11 rather than the fixed electrodes 60 to 80. As a result, similar to the angular rate sensor 100 of the first embodiment mode, the angular rate sensor 200 of the second embodiment mode can properly detect the physical quantity along the direction perpendicular to the substrate plane of the silicon substrate 11, namely along the thickness direction of the silicon substrate 11, in other words, along the "Z" direction of the rotation axis.

Third Embodiment

FIG. 10 is a diagram for schematically showing a sectional structure of a capacitance type angular rate sensor 300 according to a third embodiment of the present invention.

A plane structure of the angular rate sensor 300 is made similar to the plane structure shown in FIG. 1. FIG. 10 represents the angular rate sensor 300 mode by way of the sectional view shown in FIG. 2, namely, such a sectional view corresponding to the sectional view taken along the line II-II in FIG. 1.

Similar to the angular rate sensor 200 shown in FIG. 9, in the angular rate sensor 300, the fixed electrodes 60 to 80 are supported via the embedded oxide film 13 at respective portions which are located in the peripheral unit of the silicon substrate 11, at portions where the pads 60a to 80a are formed under cantilever conditions.

This angular rate sensor 300 is featured by that the fixed electrodes 60 to 80 are coupled under such a condition that these fixed electrodes 60 to 80 are supported by the silicon substrate 11 corresponding to the support substrate in the cantilever manner.

Further, in the angular rate sensor 300, the fixed electrodes 60 to 80 are cambered by the compression stress of the compression stress layers 90 along the direction apart from the silicon substrate 11 corresponding to the support substrate. Not only a height of a gap between the movable electrode 25 and the silicon substrate 11, but also heights of gaps between the silicon substrate 11 and the fixed electrodes 60 to 80 are larger than the thickness of the embedded oxide film 13.

As shown in FIG. 10, the compression stress layers 90 are formed on the front surface of the SOI layer 12 which corresponds to the drive-purpose fixed electrode 60, a portion of the angular rate detection-purpose fixed electrode 70, and the vibration detection-purpose fixed electrode 80.

Although not shown in FIG. 10, in the angular rate sensor 300, the compression stress layer 90 is formed on the detection beam lead 50, so that the entire portion of the movable electrode 25 is floated due to the compression stress thereof in a similar manner to that of the first embodiment mode.

The movable electrode 25 is upwardly floated from the silicon substrate 11 in substantially parallel to this silicon substrate 11, whereas the fixed electrodes 60, 70, 80 are floated from the portions of the fixed electrodes 60 to 80, in which the pads 60a to 80a are formed, namely floated from the portions which are supported via the embedded oxide film 13 in such a way that the heights of the gaps are continuously increased.

A method for manufacturing the angular rate sensor 300 is realized by executing a step for preparing the stacked layer substrate 10, a compression stress layer forming step, a trench forming step, and a release step, which is similar to the manufacturing method of the first embodiment mode.

Furthermore, in the compression stress layer forming step, the compression stress layers 90 are formed not only on the front surface of the portion which becomes the detection beam lead 50 within the SOI layer 12 corresponding to the semiconductor layer, but also on the front surfaces of the portions which become the fixed electrodes 60 to 80 within this SOI layer 12.

Then, in the release step of this third embodiment mode, since the embedded oxide film 13 corresponds to the insulating layer is removed, the detection beam lead 50 is caused to be cambered by the compression stress along the direction apart from the silicon substrate 11, and further, the fixed electrodes 60 to 80 are brought into cantilever-mode supporting condition. As a consequence, the fixed electrodes 60 to 80 are caused to be cambered by the compression stress of the compression stress layer 90 along the direction apart from the silicon substrate 11.

The angular rate sensor 300 can be manufactured in the manufacturing manner. Then, similar to the second embodiment mode, in the angular rate sensor 300, the gaps are present not only between the movable electrode 25 and the silicon substrate 11, but also between the fixed electrodes 60 to 80 and the silicon substrate 11.

In the case of such a structural arrangement, as indicated in FIG. 10, since the fixed electrodes 60 to 80 are similarly cambered, the distances between the fixed electrodes 60 to 80 and the silicon substrate 11, so that the gaps formed between the fixed electrodes 60 to 80 and the silicon substrate 11 are made wide.

Then, also, in the capacitance type angular rate sensor 300 manufactured by forming both the movable electrode 25 and the fixed electrodes 60 to 80 located opposite to the movable electrode 25 on the silicon substrate 11, it is possible to suppress lowering of the production yield, which is caused by mixing the foreign matters into the space between the movable electrode 25 and the silicon substrate 11, while the thickness of the embedded oxide film 13 corresponding to the sacrifice layer is not made thick.

Also, as represented in FIG. 10, in the angular rate sensor 300, since the movable electrode 25 is located opposite to the fixed electrodes 60 to 80 within the same plane, this angular rate sensor 300 cannot detect the physical quantity along the direction perpendicular to the substrate plane of the silicon substrate 11, namely along the thickness direction of this silicon substrate 11, namely, along the "Z" direction of the rotation axis, which is different from the angular rate sensors 100 and 200 of the first and second embodiment modes.

However, in the angular rate sensor 300, the angular rate detection-purpose vibrator 40 and the angular rate detection-purpose fixed electrode 70 are not positionally shifted in the "Z" direction of the rotation axis and are not located opposite to each other. As a result, the opposite area defined between the comb teeth-shaped unit provided in the angular rate detection-purpose vibrator 40 and the comb teeth-shaped unit provided in the angular rate detection-purpose fixed electrode 70 can be sufficiently largely secured, and thus, the electrostatic capacitance value which is formed by these comb teeth-shaped units located opposite to each other can be sufficiently largely secured in an easy manner.

Fourth Embodiment

Figure 11:
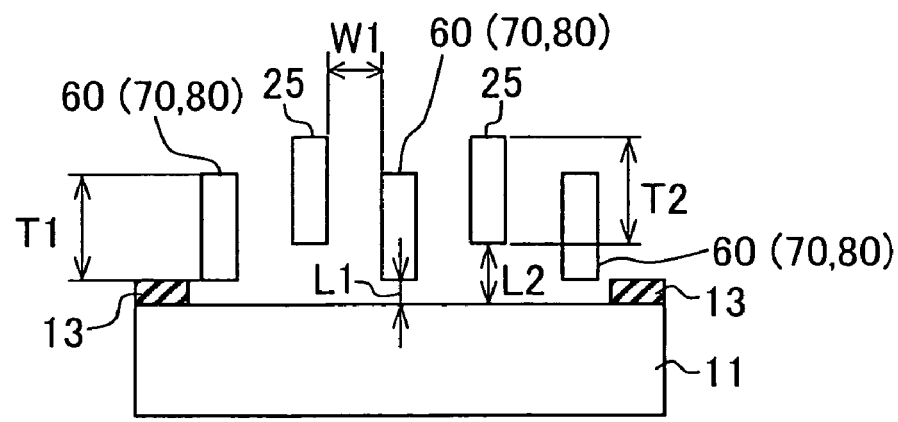
FIG. 11 is a schematic cross sectional view showing a capacitance type angular rate sensor according to a fourth embodiment of the present invention.

FIG. 11 shows a part of a capacitance type angular rate sensor 400 according to a fourth embodiment of the present invention.

In FIG. 11, T1 represents a thickness of the fixed electrode 60, 70, 80, and T2 represents a thickness of the movable electrode 25. Further, L1 represents a distance between the fixed electrode 60, 70, 80 and the support substrate 11, and L2 represents a distance between the movable electrode 25 and the substrate 11. W1 represents a distance between the fixed electrode 60, 70, 80 and the movable electrode 25.

Here, the thickness T1 of the fixed electrode 60, 70, 80 is almost equal to the thickness T2 of the movable electrode 25. Further, the distance L1 between the fixed electrode 60, 70, 80 and the substrate 11 is different from the distance L2 between the movable electrode 25 and the substrate 11. Specifically, the substrate has a flat surface, and the distance L2 between the movable electrode 25 and the substrate 11 is larger than the distance L1 between the fixed electrode 60, 70, 80 and the substrate 11. Further, the distance L1 between the fixed electrode 60, 70, 80 and the substrate 11 is larger than the distance W1 between the fixed electrode 60, 70, 80 and the movable electrode 25.

In this case, it is possible to suppress lowering of the production yield, which is caused by mixing the foreign matters into the space between the movable electrode 25 and the silicon substrate 11, while the thickness of the embedded oxide film 13 corresponding to the sacrifice layer is not made thick.

Figure 12:
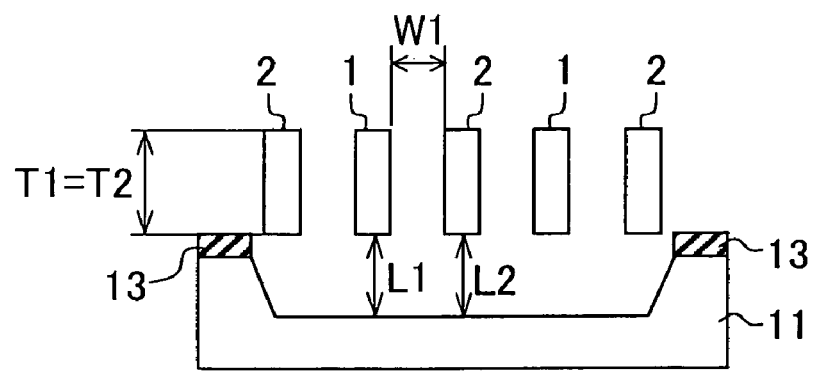
FIG. 12 is a schematic cross sectional view showing a capacitance type angular rate sensor according to a prior art.

Here, in a prior art disclosed in, for example, U.S. Pat. No. 5,427,975 and SAE Technical Paper No. 2002-01-1080, a physical quantity sensor shown in FIG. 12 is disclosed. In FIG. 12, although the thickness T1 of the fixed electrode 2 is almost equal to the thickness T2 of the movable electrode 1, the distance L1 between the fixed electrode 2 and the substrate 11 is the same as the distance L2 between the movable electrode 1 and the substrate 11. Further, the substrate 11 is not flat. Furthermore, although the distance L1 between the fixed electrode 2 and the substrate 11 is larger than the distance W1 between the fixed electrode 2 and the movable electrode 25, the distance L2 between the movable electrode 1 and the substrate 11 is not larger than the distance L1 between the fixed electrode 2 and the substrate 11. In the sensor shown in FIG. 12, it is difficult to suppress lowering of the production yield, which is caused by mixing the foreign matters into the space between the movable electrode 25 and the silicon substrate 11, while the thickness of the embedded oxide film 13 corresponding to the sacrifice layer is not made thick.

The sensor 400 is manufactured as follows.

Figure 13A:
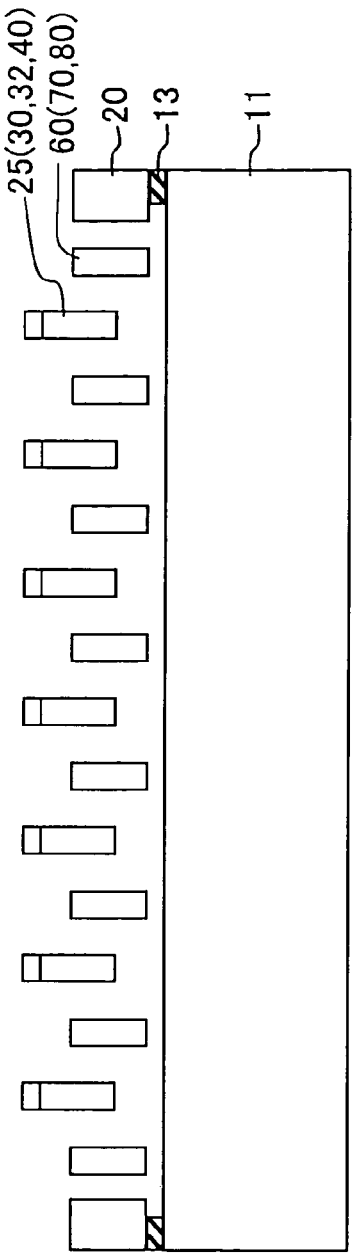
FIGS. 13A to 13C are schematic cross sectional views showing different capacitance type angular rate sensors according to modifications of the fourth embodiment.

As shown in FIG. 13A, an embedded oxide film 13 disposed under the fixed electrode 60, 70, 80 is etched together with releasing the movable electrode 25 from the substrate 11 in the embedded oxide film etching process. Thus, the sensor 400 is formed.

Figure 13B:
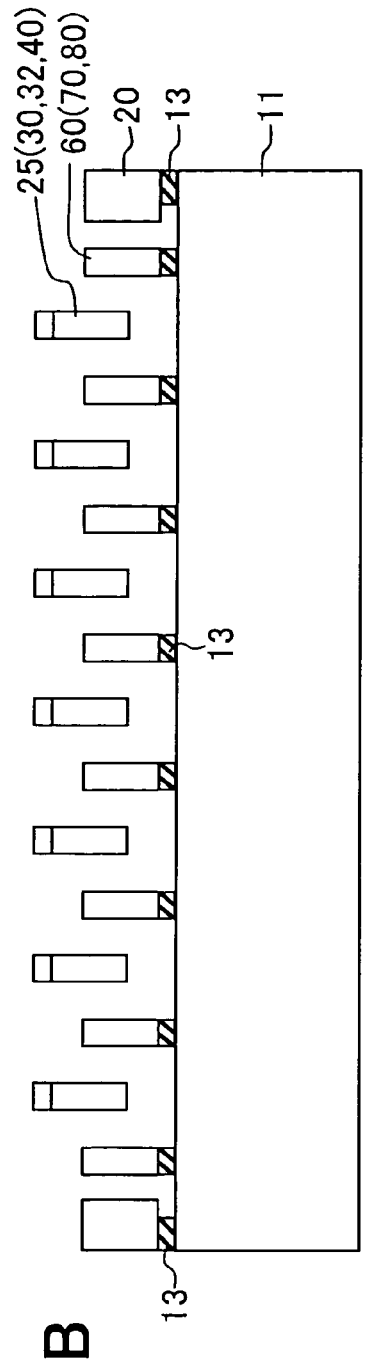
Figure 13C:
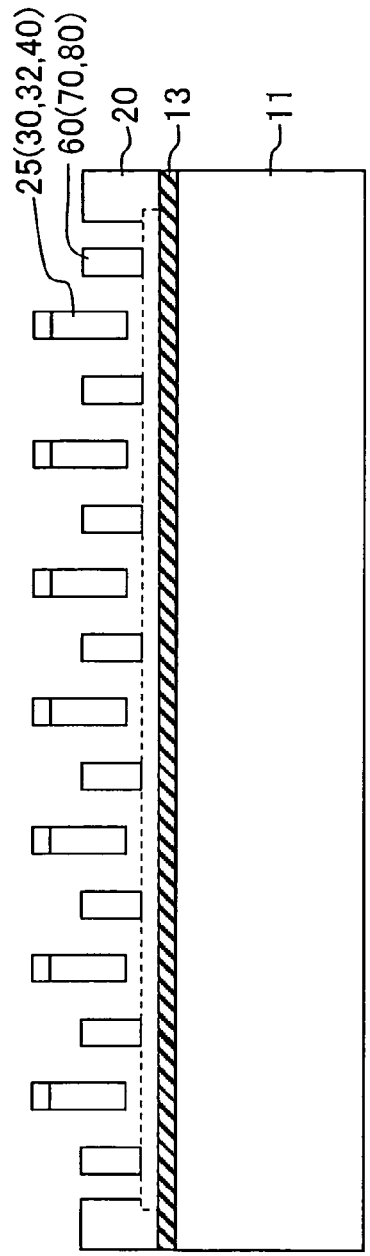

The sensor 400, can be manufactured by other methods shown in FIGS. 13B and 13C.

In FIG. 13B, an embedded oxide film 13 disposed under the fixed electrode 60, 70, 80 is not etched when the movable electrode 25 is released from the substrate 11 in the embedded oxide film etching process. Thus, the sensor 400 is formed.

In FIG. 13C, a part of the SOI layer 12, which is disposed on a side contacting an interface between the SOI layer 12 and the embedded oxide film 13, is etched, so that the movable electrode 25 is released from the substrate 11.

Figure 14A:
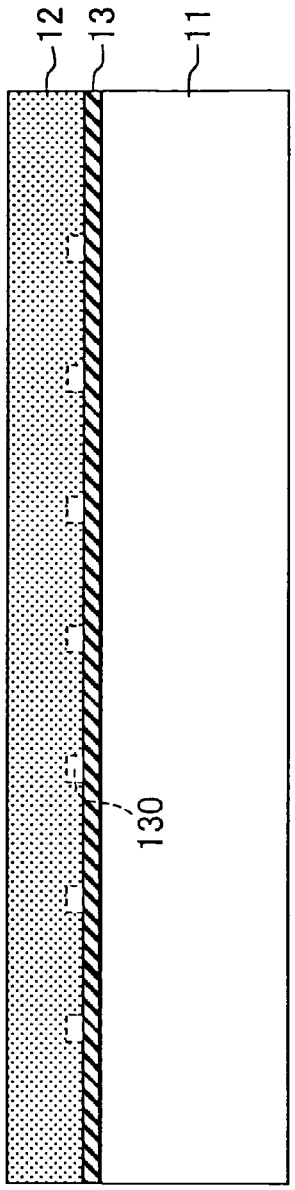
FIGS. 14A to 14C are schematic cross sectional views explaining a method for manufacturing a capacitance type angular rate sensors according to a modification of the fourth embodiment.
Figure 14B:
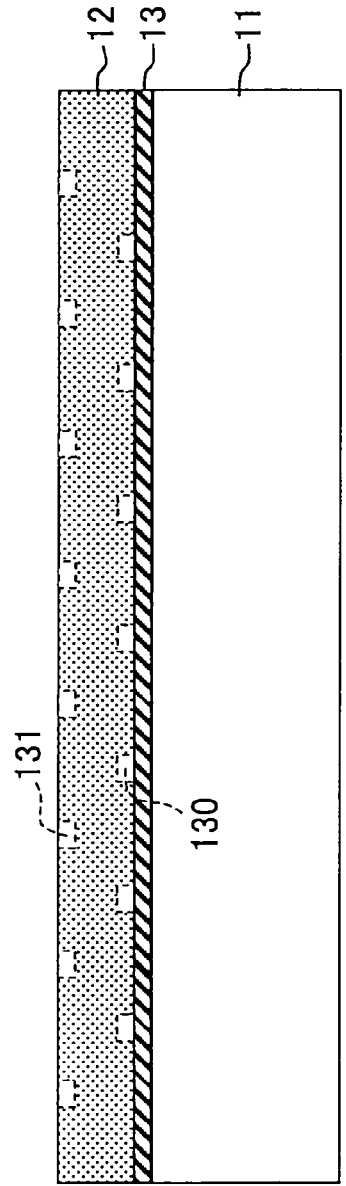
Figure 14C:
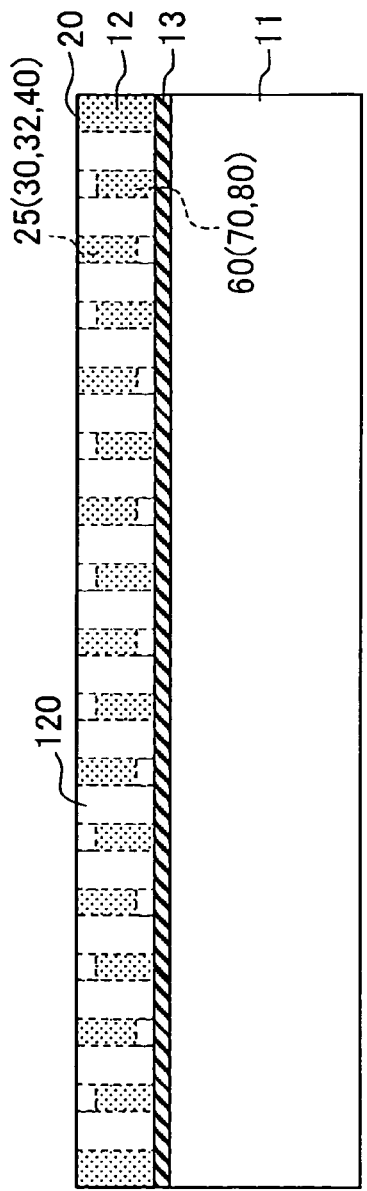

Further, the sensor can be provided without the compression stress layer 90. In this case, the sensor without the compression stress layer 90 is manufactured as follows. Firstly, as shown in FIG. 14A, a cavity 130 is formed in the SOI layer 12. Then, as shown in FIG. 14B, another cavity 131 is formed on the surface of the SOI layer 12. In FIG. 14C, the trench 120 is formed in the SOI layer 12. Thus, the surface of the SOI layer 12 is partially etched so that the cavity 131 is formed. Further, a part of the SOI layer 12, which is disposed on a side contacting an interface between the SOI layer 12 and the embedded oxide film 13, is etched so that the cavity 130 is formed. Then, the movable electrode 25 is released from the substrate 11.

(Modifications)

The above-explained first to third embodiment modes have described the methods for manufacturing the angular rate sensors 100 to 300 in such a manner that while the stacked layer substrate 10 made of the SOI substrate is employed, the process operation is carried out from the front surface thereof, namely from the front surface of the SOI layer 12. Alternatively, a rear surface processing type manufacturing method may be employed.

Specifically, in a release step, an anisotropic etching process, or the like is carried out from a rear surface of the stacked layer substrate 10, namely from an outer plane of the silicon substrate 11 in order to form a concave unit which is reached up to the embedded oxide film 13. Furthermore, the embedded oxide film 13 which is exposed from this concave unit is etched so as to be removed, so that the movable electrode 25 may be released.

Also, in the above-described embodiment modes, both the support substrate 11 and the semiconductor layer 12 are made of silicon, and the SOI (silicon-on insulator) substrate in which the insulating film 13 is made of the silicon oxide film is employed as the stacked layer substrate 10. However, the present invention is not limited only to the SOI substrate as the stacked layer substrate 10, but if the semiconductor layer 12 is stacked via the insulating layer 13 on the support substrate 11, then any types of stacked substrates may be similarly employed.

Furthermore, the shapes and the arrangements as to the movable electrode 25 and the fixed electrodes 60 to 80 employed in the angular rate sensors shown in the above embodiment modes are not limited only to the examples represented in the respective drawings.

Also, as the semiconductor physical quantity sensor, the present invention is not limited only to the angular rate sensor (gyroscope), but may be applied to an acceleration sensor, or a pressure sensor. For example, as the acceleration sensor, such a sensor may be alternatively manufactured in such a manner that while this acceleration sensor is equipped with a movable electrode and a fixed electrode located opposite to this movable electrode, the movable electrode can be moved along an application direction of acceleration to be measured, and then, the applied acceleration is detected based upon a change in capacitances between the movable electrode and the fixed electrode, which is caused by applying thereto the acceleration.

The present invention may be applied to such a capacitance type semiconductor physical quantity sensor and a manufacturing method thereof if the capacitance type semiconductor physical quantity sensor may be arranged by that both a movable electrode and a fixed electrode located opposite to this movable electrode are formed on a support substrate, and a physical quantity is detected based upon a change in capacitances between these movable and fixed electrodes.

Then, a major point of the manufacturing method for manufacturing such a capacitance type semiconductor physical quantity sensor is mainly featured as follows. That is, while the stacked layer substrate is prepared which is manufactured by stacking the semiconductor layer via the insulating layer on the support substrate, the above compression stress layer is formed on the front surface of the portion which constitutes the coupling unit for coupling the movable electrode to the support substrate within the semiconductor layer; and after the trenches are formed with respect to the semiconductor layer and are reached from the front surface of this semiconductor layer to the insulating layer and further segment the patterns of both the movable electrode and the fixed electrodes, since the insulating layer is removed, the movable electrode is released from the support substrate, and also, such a portion where the compression stress layer is formed within the semiconductor layer is cambered along the direction apart from the support substrate by the compression stress. Other structural units of this sensor may be properly modified.

Also, a major point of the capacitance type semiconductor physical quantity sensor is mainly featured as follows. That is, the movable electrode is positionally shifted from the fixed electrodes and located opposite to these fixed electrodes under such a condition that the movable electrode is positioned on the support substrate along the direction apart from the support substrate. Other structural units of this sensor may be properly modified.

Also, the effect of the present invention is to suppress lowering of the production yield, which is caused by moving the foreign matters into the space between the movable electrode and the silicon substrate, while the thickness of the insulating layer corresponding to the sacrifice layer is not made thick. That is, since lowering of the production yield can be suppressed by employing an adhered SOI wafer in a thickness range of an embedded oxide film which may be manufactured in low cost, it is possible to provide such a sensor having high reliability.

The compression stress layer 90 can be made of thermal oxidation film, a poly crystal silicon film, a silicon nitride film and a CVD oxidation film. Here, the CVD oxidation film is formed by a CVD method.

While the invention is described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor physical quantity sensor for detecting a physical quantity, comprising:
   a support substrate;
   a movable electrode movably supported on the substrate; and
   a fixed electrode fixed on the substrate and facing the movable electrode, wherein
   the physical quantity is detected on the basis of a capacitance change of a capacitor provided between the movable electrode and the fixed electrode,
   the movable electrode faces the fixed electrode in such a manner that the movable electrode is shifted toward a direction apart from the substrate, and
   a compression stress layer disposed on a surface of a connection portion between the movable electrode and the support substrate, wherein
   the compression stress layer is capable of generating a compression stress, and
   the connection portion is cambered toward the direction apart from the substrate so that the movable electrode is shifted.

2. The sensor according to claim 1, wherein
   the compression stress layer is made of an impurity diffusion layer.

3. The sensor according to claim 2, wherein
   the compression stress layer is made of a $N^+$ diffusion layer.

4. A semiconductor physical quantity sensor for detecting a physical quantity, comprising:
   a support substrate;
   a movable electrode movably supported on the substrate; and
   a fixed electrode fixed on the substrate and facing the movable electrode, wherein
   the physical quantity is detected on the basis of a capacitance change of a capacitor provided between the movable electrode and the fixed electrode,
   the movable electrode faces the fixed electrode in such a manner that the movable electrode is shifted toward a direction apart from the substrate, and
   a compression stress layer is made of a thermal oxidation film, a poly crystal silicon film, a silicon nitride film or a CVD oxidation film.

5. A semiconductor physical quantity sensor for detecting a physical quantity, comprising:
   a support substrate;
   a movable electrode movably supported on the substrate; and
   a fixed electrode fixed on the substrate and facing the movable electrode, wherein
   the physical quantity is detected on the basis of a capacitance change of a capacitor provided between the movable electrode and the fixed electrode,
   the movable electrode has a thickness in a direction perpendicular to the substrate, the thickness which is equal to a thickness of the fixed electrode in the direction perpendicular to the substrate, and
   the movable electrode is apart from the substrate by a predetermined distance, which is different from a distance between the fixed electrode and the substrate.

6. The sensor according to claim 5, wherein
   the movable electrode is apart from the fixed electrode by a distance, which is smaller than the distance between the fixed electrode and the substrate, and
   the distance between the fixed electrode and the substrate is smaller than the distance between the movable electrode and the substrate.

7. The sensor according to claim 5, further comprising:
   a compression stress layer disposed on a surface of a connection portion between the movable electrode and the support substrate, wherein
   the compression stress layer is capable of generating a compression stress, and
   the connection portion is cambered toward a direction apart from the substrate so that the movable electrode is shifted toward the direction apart from the substrate.

8. The sensor according to claim 5, wherein
   the compression stress layer is made of an impurity diffusion layer.

9. The sensor according to claim 8, wherein
   the compression stress layer is made of a $N^+$ diffusion layer.

10. The sensor according to claim 5, wherein
    the compression stress layer is made of a thermal oxidation film, a poly crystal silicon film, a silicon nitride film or a CVD oxidation film.

* * * * *